(12) United States Patent
Kurita et al.

(10) Patent No.: US 6,930,396 B2
(45) Date of Patent: Aug. 16, 2005

(54) SEMICONDUCTOR DEVICE AND METHOD FOR MANUFACTURING THE SAME

(75) Inventors: Yoichiro Kurita, Kanagawa (JP); Toshiaki Shironouchi, Kanagawa (JP); Takashi Tetsuka, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/405,471

(22) Filed: Apr. 3, 2003

(65) Prior Publication Data

US 2003/0189259 A1 Oct. 9, 2003

(30) Foreign Application Priority Data

Apr. 5, 2002 (JP) .................................... 2002-104570

(51) Int. Cl.⁷ .................. H01L 23/48; H01L 23/52; H01L 29/40
(52) U.S. Cl. .................................................... 257/777
(58) Field of Search .................... 257/686, 777, 257/779, 787

(56) References Cited

U.S. PATENT DOCUMENTS

| | | | | |
|---|---|---|---|---|
| 5,804,882 A | * | 9/1998 | Tsukagoshi et al. | 257/783 |
| 6,005,778 A | * | 12/1999 | Spielberger et al. | 361/770 |
| 6,238,949 B1 | * | 5/2001 | Nguyen et al. | 438/106 |
| 6,351,028 B1 | * | 2/2002 | Akram | 257/686 |
| 6,400,007 B1 | * | 6/2002 | Wu et al. | 257/686 |
| 6,414,384 B1 | * | 7/2002 | Lo et al. | 257/685 |
| 6,437,449 B1 | * | 8/2002 | Foster | 257/777 |
| 6,441,481 B1 | * | 8/2002 | Karpman | 257/711 |
| 6,472,758 B1 | * | 10/2002 | Glenn et al. | 257/777 |
| 6,555,917 B1 | * | 4/2003 | Heo | 257/777 |
| 6,593,662 B1 | * | 7/2003 | Pu et al. | 257/777 |
| 6,635,962 B2 | * | 10/2003 | Shibata et al. | 257/737 |

FOREIGN PATENT DOCUMENTS

| | | |
|---|---|---|
| JP | 6-88316 | 4/1996 |
| JP | 2000-58743 | 2/2000 |
| JP | 2001-44358 | 2/2001 |
| JP | 2001-308262 | 11/2001 |
| JP | 2002-57272 | 2/2002 |
| JP | 2003-179200 | 6/2003 |
| JP | 2004-6564 | 1/2004 |

* cited by examiner

Primary Examiner—S. V. Clark
(74) Attorney, Agent, or Firm—Young & Thompson

(57) ABSTRACT

There is provided a semiconductor device in which a plurality of semiconductor chips is stacked in layers and sealed in a package, including: a lower-layer semiconductor chip which is mounted on a package board; an upper-layer semiconductor chip which is stacked via a plurality of spacers on the lower-layer semiconductor chip; at least one first conductor interconnecting electrically at least one first electrode on the lower-layer semiconductor chip and at least one first internal terminal on the package board; at least one second conductor electrically interconnecting at least one second electrode on the upper-layer semiconductor chip and at least one second internal terminal on the package board; and the package for sealing therein the lower-layer semiconductor chip, the upper-layer semiconductor chip, and the at least one first conductor and the at least one second conductor which are all on the package board.

33 Claims, 17 Drawing Sheets

81;semi-spherical spacer

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same and, more particularly to, the semiconductor device in which a plurality of semiconductor chips is stacked in layers on a package board and sealed in a package, and the method for manufacturing the same.

The present application claims priority of Japanese Patent Application No. 2002-104570 filed on Apr. 5, 2002, which is hereby incorporated by reference.

2. Description of the Related Art

A Large Scale Integration (LSI), which represents semiconductor devices, has been increasingly improved in performance owing to an improvement in integration density, thus finding its applications in a variety of electronic apparatuses. Such semiconductor devices, especially those used in a mobile information processing apparatus such as a cellular phone remarkably proliferated recently, are required to be more compact in order to further give merits of portability thereof while keeping high performance. As the semiconductor device to meet such a requirement is there known such a structure that a plurality of semiconductor chips is stacked in layers on a package board and sealed in a package.

FIG. 20 is a cross-sectional view for showing a structure of one example of a conventional semiconductor device 100 having the above-mentioned structure in which a plurality of semiconductor chips having roughly the same size is stacked one on another. In this semiconductor device 100, as shown in FIG. 20, on a package board 102 having internal terminals 108 and 111 as many as two or more each on its right side of surface and a plurality of projecting external terminals 101 on its back side of surface are there stacked in layers a first semiconductor chip 103 and a second semiconductor chip 104 which have roughly the same size with a spacer chip 105 therebetween and also which are both made of silicon, in such a configuration that pad electrodes 107 on the first semiconductor chip 103 are electrically connected with the internal terminals 108 on the package board 102 by first bonding wires 109, while similarly pad electrodes 110 on the second semiconductor chip 104 are electrically connected with the internal terminals 111 by second bonding wires 112. Furthermore, the first semiconductor chip 103, the spacer chip 105, and the second semiconductor chip 104 are mounted with adhesive agents 113 through 115 respectively. The entire structure including the first and second semiconductor chips 103 and 104 and the first and second bonding wires 109 and 112 on the package board 102 is sealed in a package 106 made of thermo-hardening resin.

As described above, by placing the spacer chip 105 between them, the first and second semiconductor chips 103 and 104 can have a sufficient spacing therebetween. Therefore, the first bonding wires 109 connected to the first semiconductor chip 103 are protected by the spacer chip 105, because the first bonding wires 109 can be prevented from being damaged due to the coming in contact with the second semiconductor chip 104 to short-circuit therewith or vice versa. By providing such a configuration of the semiconductor device 100 in which the respective pluralities of first and second semiconductor chips 103 and 104 are stacked in layers, it is possible to implement such a semiconductor device. The following will describe a method for manufacturing this semiconductor device 100 along steps thereof, with reference to FIGS. 21A to 21F.

First, as shown in FIG. 21A, on the right side of the package board 102 having the respective pluralities of internal terminals 108 and 111 formed on its right side, the first semiconductor chip 103 is mounted via the adhesive agent 113. This first semiconductor chip 103 has the plurality of pad electrodes 107 which is formed at its side edge portions beforehand. Next, as shown in FIG. 21B, the first bonding wires 109 are connected by a wire bonding method between the pad electrodes 107 on the first semiconductor chip 103 and the internal terminals 108 on the package board 102.

Next, as shown in FIG. 21C, the spacer chip 105 made of silicon is mounted on the first semiconductor chip 103 via the adhesive agent 114. As described above, this spacer chip 105 is used to protect the first bonding wires 109. Next, as shown in FIG. 21D, the second semiconductor chip 104 is mounted on the spacer chip 105 via the adhesive agent 115. This second semiconductor chip 104 has the plurality of pad electrodes 110 which is formed at its side edge portions thereon beforehand. Next, as shown in FIG. 21E, the second bonding wires 112 are connected between the pad electrodes 110 on the second semiconductor chip 104 and the internal terminals 111 on the package board 102.

Next, as shown in FIG. 21F, thermo-hardening resin (not shown) is supplied, by a transfer molding method, over the entire structure including the first and second semiconductor chips 103 and 104 and the first and second bonding wires 109 and 112 on the package board 102 and then heated for thermo-hardening, thus completing the package 106.

Subsequently, the plurality of projecting external terminals 101 is formed on the back side of the package board 102, thus completing the semiconductor device 100 as shown in FIG. 20.

It is to be noted that in such a conventional semiconductor device as described above, the spacer chip 105 which is arranged to preserve a sufficient spacing between the first and second semiconductor chips 103 and 104 is made of silicon, which is expensive, so that the device itself is also expensive, which is a disadvantage. Furthermore, as well known, such a semiconductor device as used in a mobile information processing apparatus including a cellular phone is required not only to be more compact but also to be thinner in order to thin a relevant product, which requires in turn that the spacer chip 105 be thinned more. However, although the spacer chip 105 can be polished to a thickness of 20–30 $\mu$m owing to an improvement in the polishing technology, such a small thickness may give rise to a trouble in handling after polishing, thus making it difficult to realize a thickness of about 100 $\mu$m or less essentially. This gives a restriction on the thinning of the semiconductor devices.

An example of the above-mentioned semiconductor device structure in which a plurality of semiconductor chips is stacked on a package board is disclosed in, for example, Japanese Patent Application Laid-open No. 2001-308262. In a semiconductor device 200 disclosed therein, as shown in FIG. 22, on a package board 202 having a plurality of projecting external terminals 201 formed on its back side, a first semiconductor chip 204 is mounted via an adhesive agent 203, on which is there stacked a second semiconductor chip 205 via an adhesive agent 206, so that the first and second semiconductor chips 204 and 205 are sealed in a package 207 made of resin. Between pad electrodes (not shown) on the first semiconductor chip 204 and internal terminals (not shown) on the package board 202 there are connected first bonding wires 208, while between pad electrodes (not shown) on the second semiconductor chip 205 and internal terminals (not shown) on the package board 202 there are connected second bonding wires 209. Furthermore, the right side of the first semiconductor chip 204 is covered by an overcoat layer 210.

It is to be noted that the adhesive agent 206 used to adhere the first and second semiconductor chips 204 and 205 to each other is intended to be supplied enough to cover the first bonding wires 208 connected to the first semiconductor chip 204 and also to fill a spacing (gap) between the first and second semiconductor chips 204 and 205.

Again, in the semiconductor device disclosed in Japanese Patent Application Laid-open No. 2001-308262, the adhesive agent used to stack the plurality of semiconductor chips is liable to fluctuate in quantity, so that it is difficult to preserve a uniform spacing between the semiconductor chips, thus giving rise to a problem of a decrease in reliability and a difficulty in thinning of the semiconductor device 200.

That is, in the semiconductor device disclosed in the above-mentioned publication in which, as shown in FIG. 22, the first and second semiconductor chips 204 and 205 are stacked one on the other with the adhesive agent 206 therebetween, in which case, however, it is difficult to regulate the quantity of the adhesive agent 206 at a uniform value, which in turn makes it difficult to preserve a uniform spacing between the first and second semiconductor chips 204 and 205. For example, if the adhesive agent 206 is supplied less, the upper-layer second semiconductor chip 205 is liable to be tilted in posture, so that the first bonding wires 208 connected to the first semiconductor chip 204 may come in contact with the second semiconductor chip 205, which is a problem.

Moreover, in this case where the quantity of the supplied adhesive agent 206 is small, a minute gap may readily occur between the first and second semiconductor chips 204 and 205 and be left as it is highly possibly. That is, it is difficult to inject resin into this minute gap in the subsequent process even by the transfer molding method, so that this gap remains as it is. Therefore, the gap, thus left in the semiconductor device 200, is infiltrated by water, to deteriorate the moisture resistance of the semiconductor device 200 as time passes by, thus damaging the reliability thereof.

If, for example, the adhesive agent 206 is supplied in excess, on the other hand, a sufficient spacing is preserved between the first and second semiconductor chips 204 and 205, so that it is possible to prevent the first bonding wires 208 and the second semiconductor chip 205 from coming in contact with each other, but it is difficult to keep the gap therebetween uniform, thus making it difficult to thin the semiconductor device 200. Moreover, in this case where the quantity of the supplied adhesive agent 206 is excessive, an extra quantity of the adhesive agent 206 may flow out of side edge portions of the first semiconductor chip 204 over to the package board 202 to thereby cover the internal terminals (not shown), thus making it difficult to apply the wire bonding method to the second semiconductor chip 205 in the following process. Furthermore, part of the adhesive agent 206, if it flows out of the side edge portions of the semiconductor chip 204, goes through to the first bonding wire 208, so that a difference in coefficient of thermal expansion between this adhesive agent 206 and resin which is used in the following transfer molding process causes stress to be applied on the first bonding wires 208. In the worst case, the first bonding wires 208 may be disconnected finally, thus further deteriorating the reliability of the semiconductor device 200.

SUMMARY OF THE INVENTION

In view of the above, it is an object of the present invention to provide a semiconductor device in which a plurality of semiconductor chips is stacked in layers and sealed in a package and which can be improved in reliability and thinned, and a method for manufacturing the same.

According to a first aspect of the present invention, there is provided a semiconductor device in which a plurality of semiconductor chips is stacked in layers and sealed in a package, wherein:

an upper-layer semiconductor chip is stacked via a plurality of spacers on a lower-layer semiconductor chip;

at least one of the plurality of spacers is formed on the lower-layer semiconductor chip; and the upper-layer semiconductor chip, the plurality of spacers, and the lower-layer semiconductor chip are sealed in the package.

In the foregoing first aspect, a first preferable mode is one wherein the plurality of spacers is made up of a projecting structure.

A second preferable mode is one wherein the package is made up of an insulator.

A third preferable mode is one wherein the package is made up of a container which seals therein an inert gas.

A fourth preferable mode is one wherein the plurality of spacers is made up of an insulator.

A fifth preferable mode is one wherein the insulator is made of thermo-hardening resin, fast-hardening resin, or photo-hardening resin.

A sixth preferable mode is one wherein the upper-layer semiconductor chip is stacked via an adhesive agent on the lower-layer semiconductor chip.

A seventh preferable mode is one wherein the adhesive agent is made of thermo-hardening resin.

An eighth preferable mode is one wherein the plurality of spacers is made up of a conductor.

A ninth preferable mode is one wherein an insulating sheet is formed on a surface of the upper-layer semiconductor chip, the surface facing the lower-layer semiconductor chip.

A tenth preferable mode is one wherein the plurality of semiconductor chips stacked in the layers is different in size from each other.

An eleventh preferable mode is one wherein connection in a flip-chip manner is applied to at least one semiconductor chip out of the plurality of semiconductor chips stacked in the layers.

According to a second aspect of the present invention, there is provided a semiconductor device in which a plurality of semiconductor chips is stacked in layers and sealed in a package, including:

a lower-layer semiconductor chip which is mounted on a package board;

an upper-layer semiconductor chip which is stacked via a plurality of spacers on the lower-layer semiconductor chip;

at least one first conductor interconnecting electrically at least one first electrode on the lower-layer semiconductor chip and at least one first internal terminal on the package board;

at least one second conductor electrically interconnecting at least one second electrode on the upper-layer semiconductor chip and at least one second internal terminal on the package board; and the package sealing therein the lower-layer semiconductor chip, the upper-layer semiconductor chip, and the at least one first conductor and the at least one second conductor which are all on the package board.

In the foregoing second aspect, a preferable mode is one wherein the package board is made of an insulating board.

Another preferable mode is one wherein at least one external terminal is formed on a back side which is opposite to a right side of the package board on which the at least one first internal terminal and the at least one second terminal are respectively formed.

Still another preferable mode is one wherein connection in a flip-chip manner is applied to at least one of the plurality of semiconductor chips is, in stead of using the at least one first conductor or the at least one second conductor.

According to a third aspect of the present invention, there is provided a semiconductor device manufacturing method for stacking a plurality of semiconductor chips in layers and sealing the plurality of semiconductor chips in a package, including the steps of:

forming a plurality of spacers on a lower-layer semiconductor chip;

stacking an upper-layer semiconductor chip via the plurality of spacers on the lower-layer semiconductor chip; and sealing the lower-layer semiconductor chips, the plurality of spacers, and the upper-layer semiconductor chip in an insulating material making up the package.

According to a fourth aspect of the present invention, there is provided a semiconductor device manufacturing method for stacking a plurality of semiconductor chips in layers and sealing the plurality of semiconductor chips in a package, including:

a lower-layer semiconductor chip mounting step of mounting a lower-layer semiconductor chip on a package board;

a first connecting step of interconnecting electrically at least one first internal terminal on the package board and at least one first electrode on the lower-layer semiconductor chip using at least one first conductor;

a spacer formation step of forming a plurality of spacers on the lower-layer semiconductor chip;

an upper-layer semiconductor chip stacking step of stacking an upper-layer semiconductor chip via the plurality of spacers on the lower-layer semiconductor chip;

a second connecting step of interconnecting electrically at least one second internal terminal on the package board and at least one second electrode on the upper-layer semiconductor chip using at least one second conductor; and a sealing step of sealing the lower-layer semiconductor chip, the upper-layer semiconductor chip, and the at least one first conductor and the at least one second conductor in an insulating material making up the package.

In the foregoing fourth aspect, a first preferable mode is one wherein the spacer formation step is performed after the first connecting step.

A second preferable mode is one wherein the spacer formation step is performed before the first connecting step.

A third preferable mode is one wherein the spacer formation step is performed by supplying liquid resin and then hardening the liquid resin.

A fourth preferable mode is one wherein the liquid resin is supplied using a potting method, a screen printing method, or a non-contact type jet dispenser method.

A fifth preferable mode is one that wherein the method includes an adhesive agent formation step of forming an adhesive agent on the lower-layer semiconductor chip before the upper-layer semiconductor chip stacking step.

A sixth preferable mode is one that wherein the method includes an insulating sheet formation step of forming an insulating sheet on a surface of the upper-layer semiconductor chip, the surface facing the lower-layer semiconductor chip, before the upper-layer semiconductor chip stacking step.

A seventh preferable mode is one wherein the spacer formation step is performed using thermo-hardening resin, fast-hardening resin, or photo-hardening resin.

An eighth preferable mode is one wherein the spacer formation step is performed by supplying an adhesive agent into which a particulate insulating material is mixed.

A ninth preferable mode is one wherein, in the first connecting step, at least one first internal terminal on the package board and at least one first electrode on the lower-layer semiconductor chip are interconnected electrically using a first flip-chip connection method, in stead of the first conductor.

A tenth preferable mode is one wherein, in the second connecting step, at least one second internal terminal on the package board and at least one second electrode on the lower-layer semiconductor chip are interconnected electrically using a second flip-chip connection method, in stead of the second conductor.

With the above configurations, an upper-part semiconductor chip is stacked via a plurality of spacers on a lower-part semiconductor chip in layers, thus enabling preserving a uniform spacing between the upper-part and lower-part semiconductor chips.

Furthermore, it is possible to form spacers via which an upper-part semiconductor chip is stacked on a lower-part semiconductor chip with a uniform spacing preserved therebetween, using a potting method, a screen printing method, or a non-contact type jet dispenser method, thus well controlling the height of the spacers.

Therefore, a semiconductor device in which a plurality of semiconductor chips is stacked in layers and sealed in a package can be thinned and improved in reliability.

BRIEF DESCRIPTION OF THE DRAWINGS

The above and other objects, advantages, and features of the present invention will be more apparent from the following description taken in conjunction with the accompanying drawings, in which.

DESCRIPTION OF THE PREFERRED EMBODIMENTS

Best modes of carrying out the present invention will be described in further detail using various embodiments with reference to the accompanying drawings. The description is made specifically with reference to the embodiments.

First Embodiment

Figure 1:
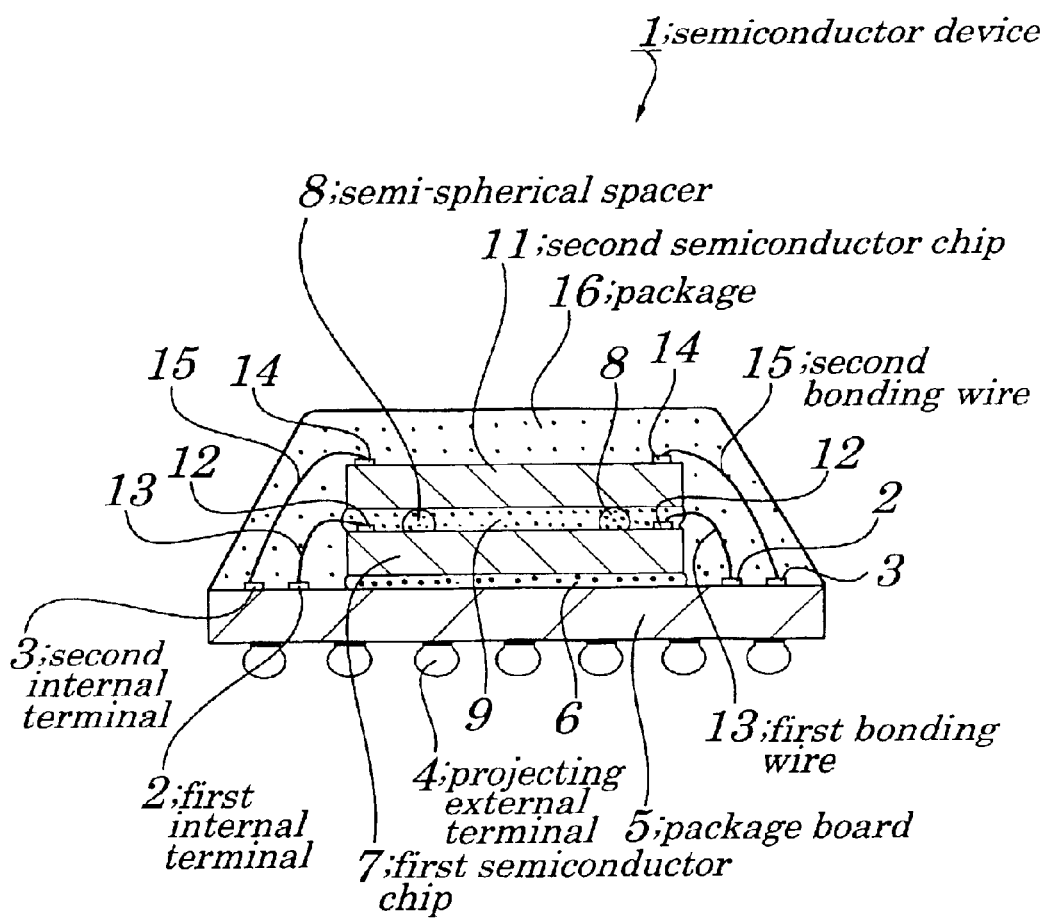
FIG. 1 is a cross-sectional view for showing a configuration of a semiconductor device according to a first embodiment of the present invention.

FIG. 1 is a cross-sectional view showing a configuration of a semiconductor device according to a first embodiment of the present invention; FIGS. 2A to 2G are flow diagrams for showing a first method for manufacturing the semiconductor device according to the first embodiment, along steps thereof; and FIG. 3 is an illustration for outlining one step of the first method for manufacturing the semiconductor device according to the first embodiment. As shown in FIG. 1, a semiconductor device 1 according to the present embodiment includes a first semiconductor chip (lower-layer semiconductor chip) 7 which is made of silicon and mounted (fixed) using an adhesive agent 6 on a package board 5 having a plurality of first internal terminals 2 and another plurality of second internal terminals 3 which are both formed on a right side of a surface thereof and a plurality of projecting external terminals 4 which is formed on a back side of the surface thereof; a second semiconductor chip (upper-layer semiconductor chip) 11 which has roughly the same size as the first semiconductor chip 7 and is stacked on the first semiconductor chip 7 via a plurality of semi-spherical spacers 8 and an adhesive agent 9; first bonding wires (conductor) 13 for electrically connecting pad electrodes 12 on the first semiconductor chip 7 and the first internal terminal 2 on the package board 5; second bonding wires (conductor) 15 for electrically interconnecting pad electrodes 14 on the second semiconductor chip 11 and the second internal terminals 3 on the package board 5; and a package 16 which is made of thermo-hardening resin (insulator) for sealing therein the first semiconductor chip 7, the second semiconductor chip 11, the first bonding wires 13, and the second bonding wires 15 which are on the package board 5.

The package board 5 is made up of a known insulating board made of glass epoxy, ceramic, poly-imide, poly-amide, or a like, in such a configuration that the respective pluralities of first and second internal terminals 2 and 3 formed on the right side thereof are both made of copper (Cu), nickel (Ni), or Ni/Au (nickel/gold) sequentially plated on Cu, or a like, while the plurality of projecting external terminals 4 formed on the back side thereof is made of a soldered ball, a ball containing Au or Cu, or a like. It is to be noted that the first and second internal terminals 2 and 3 and the external terminals 4 are all made conductive through the package board 5. The projecting external terminals 4 are used to solder the semiconductor device 1 to a printed-circuit board (not shown) of any one of a variety of electronic apparatuses when the semiconductor device 1 is installed therein.

The plurality of semi-spherical spacers 8 is formed to protect the first bonding wires 13 connected to the first semiconductor chip 7 by preventing the first bonding wires 13 from coming in contact with the second semiconductor chip 11, so that for this purpose, these semi-spherical spacers 8 are formed to such a height that a uniform spacing of 60–70 μm may be preserved between the first and second semiconductor chips 7 and 11. These semi-spherical spacers 8 are formed of, for example, thermo-hardening resin known as CRM1575C (trade name) made by Sumitomo Bakelite Co. Ltd. These semi-spherical spacers 8 may also be made of, for example, fast-hardening resin known as URF107ND (trade name) made by Nagase & Co. Ltd. or, for example, acrylate-based, polyene/polythiol-based, or epoxy-based photo-hardening resin. When any one of fast-hardening resin and photo-hardening resin as described above is used, in particular, heat treatment for thermo-hardening can be eliminated, thus improving a producing capacity of the step of forming the semi-spherical spacers 8. As described later, the semi-spherical spacers 8 are formed using a potting method, a screen printing method, or a like. The adhesive agent 9, on the other hand, is supplied to mount the second semiconductor chip 11 via the semi-spherical spacers 8 on the first semiconductor chip 7 and made of the above-mentioned thermo-hardening resin as in the case of the semi-spherical spacers 8.

The pad electrodes 12 on the first semiconductor chip 7 and the pad electrodes 14 on the second semiconductor chip 11 are both made of Al, Au, or a like, similar to which the first and second bonding wires 13 and 15 are both made of Al, Au, or a like. Furthermore, the package 16 is made of thermo-hardening resin such as epoxy resin, urethane resin, phenol resin, or a like using a known transfer molding method as described later. By thus performing packaging using thermo-hardening resin in accordance with the transfer molding method, the semiconductor device 1 can be manufactured at a low cost. It is to be noted that the first and second semiconductor chips 7 and 11 which are stacked one on the other may be both a logic product, a combination of logic and memory products, or any other arbitrarily selected products.

In such the semiconductor device 1 as described above, the first and second semiconductor chips 7 and 11 are stacked one on the other not via an adhesive agent which is conventionally used and difficult to regulate at a constant supply quantity but via the semi-spherical spacers 8 which can be formed uniformly in height with good controllability, thus enabling a uniform spacing of the first and second semiconductor chips 7 and 11. Therefore, the first and second semiconductor chips 7 and 11 can be held parallel always, to eliminate such a trouble that the first bonding wires 13 connected to the first semiconductor chip 7 may come in contact with the second semiconductor chip 11. Furthermore, since the first and second semiconductor chips 7 and 11 are not stacked one on the other via the adhesive agent, as it is conventionally difficult to regulate the adhesive agent at a constant supply quantity, there is no possibility that a minute gap may be formed between the first and second semiconductor chips 7 and 11. Moreover, the semi-spherical spacers 8 are formed to a minimum required height to preserve a uniform spacing between the first and second semiconductor chips 7 and 11 such that the first bonding wires 13 may not come in contact with the second semiconductor chip 11, thus easily enabling thinning the semiconductor device 1.

The following will describe a first method for manufacturing the semiconductor device 1 according to the present embodiment, with reference to FIGS. 2A to 2G.

Figure 2A:
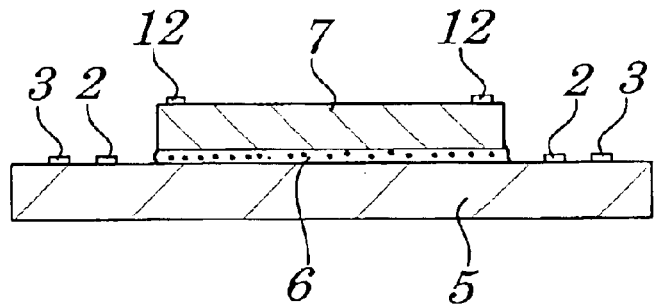
FIGS. 2A to 2G are flow diagrams for showing a first method for manufacturing the semiconductor device according to the first embodiment, along steps thereof.
Figure 3:
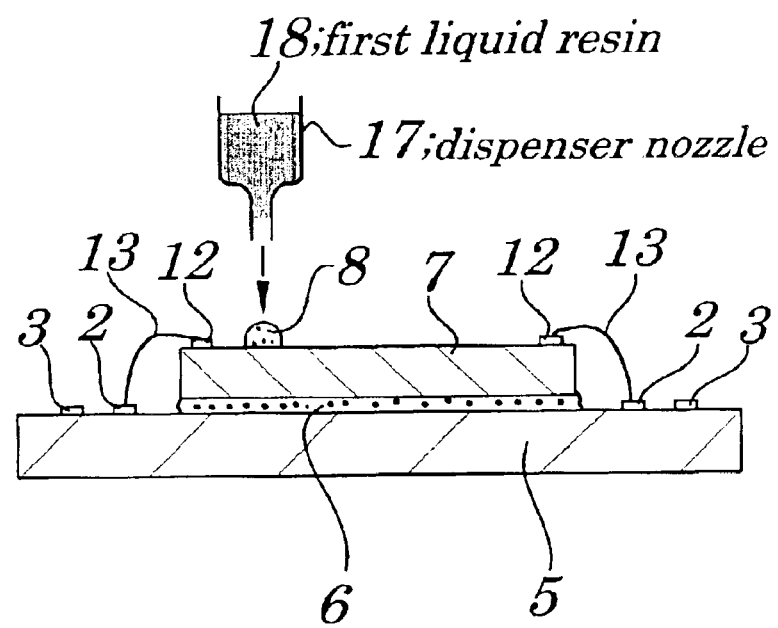
FIG. 3 is an illustration for outlining one step of the first method for manufacturing the semiconductor device according to the first embodiment.

First, as shown in FIG. 2A, the first semiconductor chip 7 is mounted via the adhesive agent 6 on the right side of the package board 5 which is made of glass epoxy, ceramic, poly-imide, poly-amide, or a like and which has the plurality of first internal terminals 2 and the plurality of second internal terminals 3 both made of Cu, Ni, or the like formed on its right side as described above. At side edge portions of this first semiconductor chip 7 there are formed the plurality of pad electrodes 12 made of Al, Au, or a like beforehand.

Figure 2B:
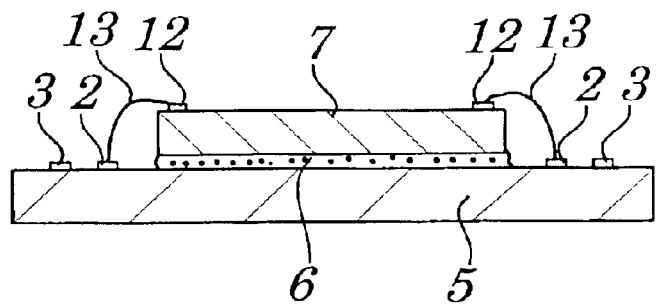

Next, as shown in FIG. 2B, the first bonding wires 13 made of Al, Au, or the like are connected by a wire bonding method between the pad electrode 12 on the first semiconductor chip 7 and the first internal terminals 2 on the package board 5.

Figure 2C:
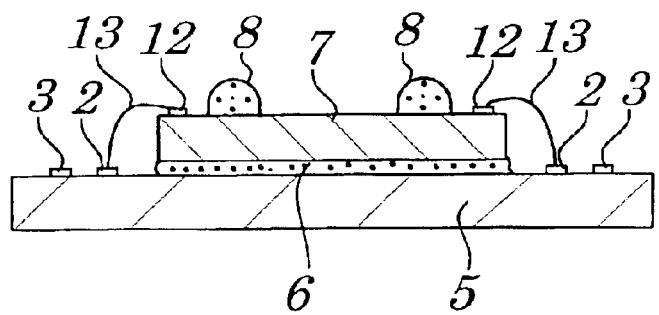
Figure 4:
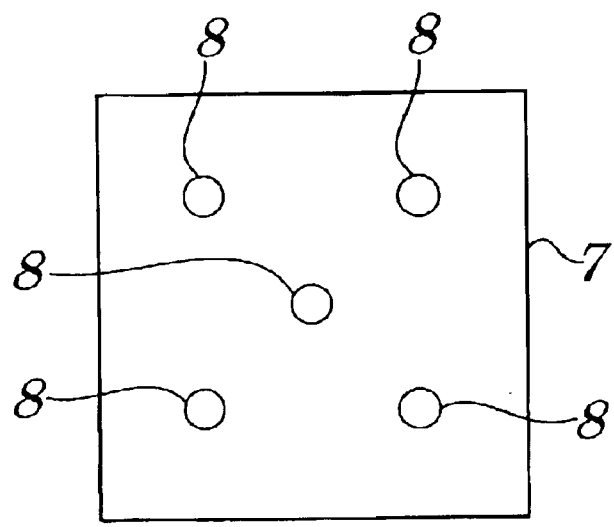
FIG. 4 is a plan view for showing a semiconductor chip in a half-way step of the first method for manufacturing the semiconductor device according to the first embodiment.

Next, as shown in FIG. 2C, the plurality of semi-spherical spacers 8 having a height of 60 to 70 μm is formed on the first semiconductor chip 7 by a potting method. The plurality of semi-spherical spacers 8 is specifically formed by, as shown in FIG. 3, supplying through a dispenser nozzle 17 a desired quantity of first liquid resin 18 made of, for example, the above-mentioned thermo-hardening resin known as CRM1575C (trade name) made by Sumitomo Bakelite Co. Ltd. onto the first semiconductor chip 7 at a desired position thereon and then hardening the first liquid resin 18 under heat. Alternatively, in place of this thermo-hardening resin, the above-mentioned fast-hardening or photo-hardening resin can be used to form the semi-spherical spacers 8. In this case, heat treatment for thermo-hardening is unnecessary. Preferably, as shown in FIG. 4, these semi-spherical spacers 8 are arranged, for example, approximately at four corner portions and a center portion on a surface of the first semiconductor chip 7 in order to stably stack the second semiconductor chip 11 on this first semiconductor chip 7 in the subsequent step. It is to be noted that the spacer arranged roughly at the center portion has a role of preventing flexion from occurring at the center portion of the second semiconductor chip 11 under the weight of the center portion especially when the second semiconductor chip 11 is large in size. If the second semiconductor chip 11 is small in size, however, the semi-spherical spacers 8 need not necessarily be arranged at the center portion. In principle, the semi-spherical spacers 8 need to be arranged at three positions on the first semiconductor chip 7. These semi-spherical spacers 8 can be formed to a uniform height of 60 to 70 μm with good controllability by utilizing the potting method.

Figure 2D:
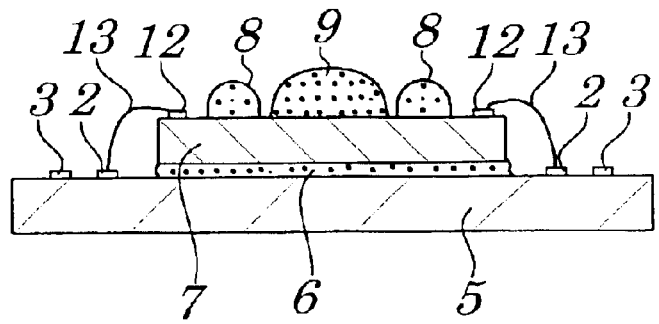

Next, as shown in FIG. 2D, the adhesive agent 9 made of second liquid resin (not shown) is supplied by the potting method roughly at the center portion on the first semiconductor chip 7. This second liquid resin (not shown), which may be thermo-hardening resin similar to the above-mentioned first liquid resin, can be applied through the dispenser nozzle 17. This adhesive agent 9, however, is intended to remain unhardened as thermo-hardening resin. This adhesive agent 9 is used to adhere and mount the second semiconductor chip 11 on the first semiconductor chip 7 but not to preserve a uniform spacing between the first and second semiconductor chips 7 and 11, so that spread thereof only needs to be regulated to such an extent that the first semiconductor chip 7 can be mounted.

Figure 2E:
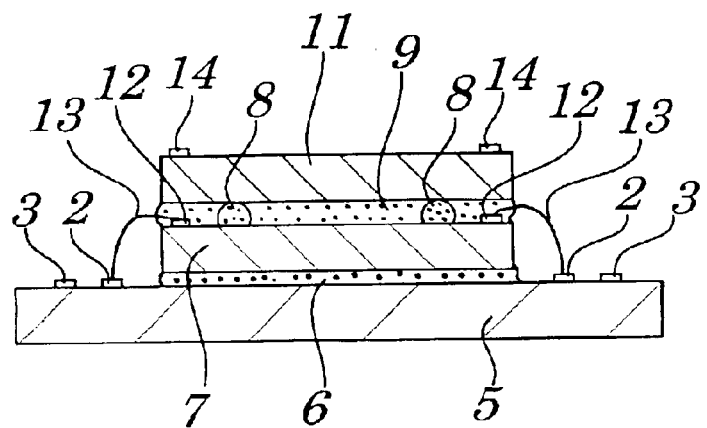

Next, as shown in FIG. 2E, the second semiconductor chip 11 is mounted via the plurality of semi-spherical spacers 8 and the adhesive agent 9 on the first semiconductor chip 7. At side edge portions of this second semiconductor chip 11 there are formed the plurality of pad electrodes 14 made of Al, Au, or a like beforehand. In this case, since the semi-spherical spacers 8 having a uniform height are already formed on the first semiconductor chip 7, the second semiconductor chip 11 is stacked under a uniform and constant height, via the adhesive agent 9 on the first semiconductor chip 7. Therefore, the first bonding wires 13 connected to the first semiconductor chip 7 are protected by the semi-spherical spacers 8 and so do not come in contact with the second semiconductor chip 11.

Figure 2F:
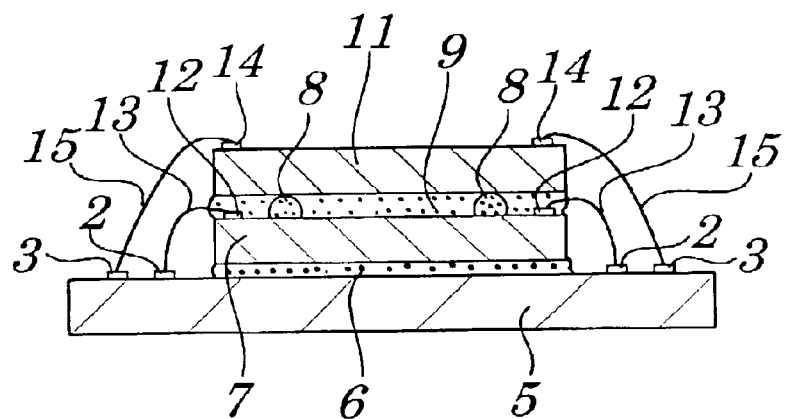

Next, the adhesive agent 9 yet to be hardened is heated and hardened thermally and then, as shown in FIG. 2F, the second bonding wires 15 made of Al, Au, or a like are connected by the wire bonding method between the pad electrodes 14 on the second semiconductor chip 11 and the second internal terminals 3 on the package board 5.

Figure 2G:
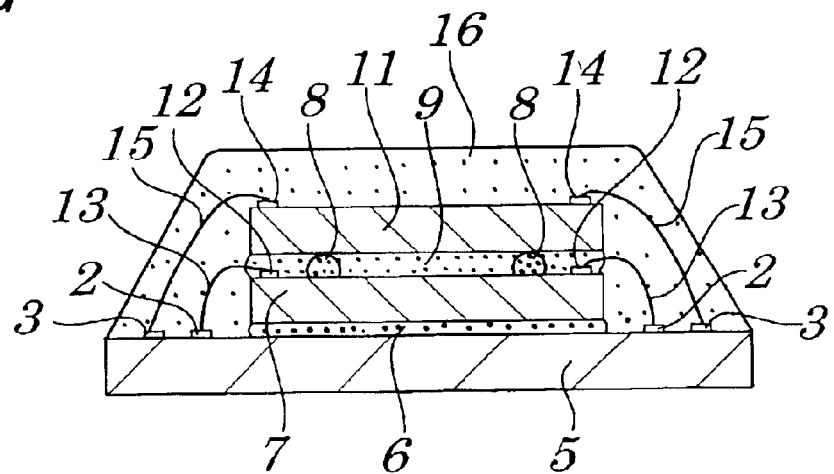

Next, as shown in FIG. 2G, by the transfer molding method, thermo-hardening resin (not shown) is supplied over the entire structure including the first and second semiconductor chips 7 and 11 and the first and second bonding wires 13 and 15 on the package board 5 in such a manner as to be sealed therein, thus forming the package 16.

Next, by forming the above-mentioned projecting external terminals 4 like solder balls on the back side of the package board 5, the semiconductor device 1 such as shown in FIG. 1 is completed.

Figure 5A:
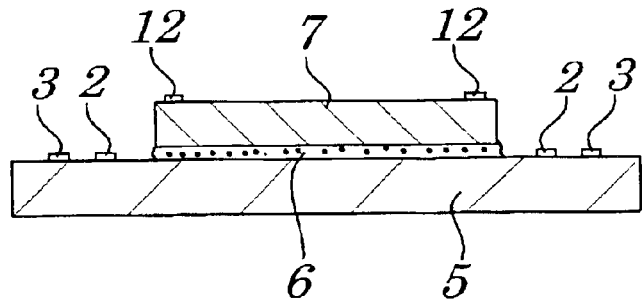
FIGS. 5A to 5C are flow diagrams for showing a second method for manufacturing the semiconductor device according to the first embodiment, along steps thereof.
Figure 5B:
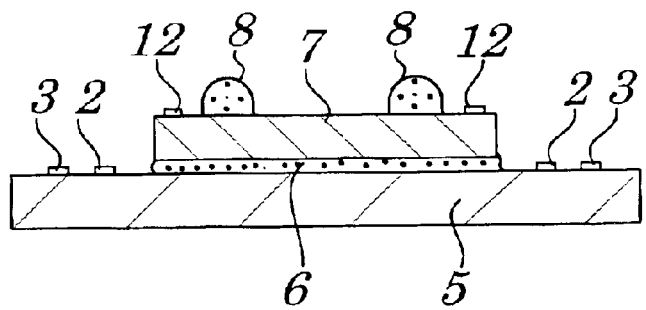
Figure 5C:
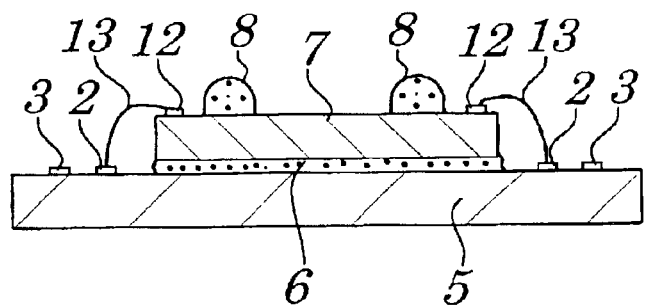

The following will describe sequentially a second method for manufacturing the semiconductor device according to the present embodiment, with reference to FIGS. 5A-5C. This second manufacturing method differs from the above-mentioned first manufacturing method in a respect of forming the semi-spherical spacers 8 using a screen printing method in place of the potting method.

First, as shown in FIG. 5A, in roughly the same manner as FIG. 2A of the first manufacturing method, on the right side of the package board 5 which is made of glass epoxy, ceramic, poly-imide, poly-amide, or the like and has the plurality of first internal terminals 2 and the plurality of second internal terminals 3 both made of Cu, Ni, or the like formed on its right side, the first semiconductor chip 7 is mounted via the adhesive agent 6. At the side edge portions of this first semiconductor chip 7 are there formed the plurality of pad electrodes 12 made of Al, Au, or the like beforehand.

Figure 6:
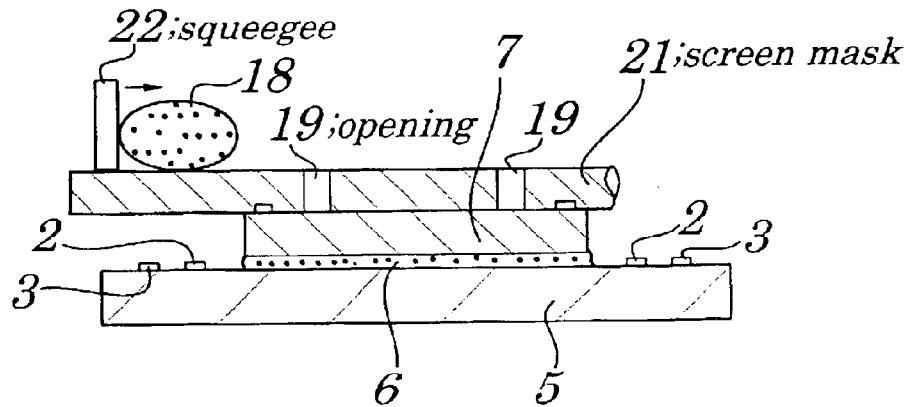
FIG. 6 is an illustration for outlining one step of the second method for manufacturing the semiconductor device according to the first embodiment.

Next, as shown in FIG. 5B, the plurality of semi-spherical spacers 8 having a height of 60–70 μm is formed on the first semiconductor chip 7 by using the screen printing method. As shown in FIG. 6, the plurality of semi-spherical spacers 8 is formed by supplying, using a squeegee 22, a desired quantity of the first liquid resin 18 made of, for example, the above-mentioned thermo-hardening resin known as CRM1575C (trade name) made by Sumitomo Bakelite Co. Ltd. into openings 19 which are formed in a screen mask 21 at such a position on the first semiconductor chip 7 that the semi-spherical spacers 8 are to be formed and then thermo-hardening the first liquid resin 18. Such semi-spherical spacers 8 can be formed to a height of 60–70 μm with good controllability even when using the screen printing method.

Next, as shown in FIG. 5C, the first bonding wires 13 made of Al, Au, or the like are connected by the wire bonding method between the pad electrode 12 on the first semiconductor chip 7 and the first internal terminals 2 on the package board 5.

By this second manufacturing method according to the present embodiment, the semi-spherical spacers 8 are thus formed on the first semiconductor chip 7 before the first bonding wires 13 are bonded to the first semiconductor chip 7, in order to avoid damages which may occur when the screen mask 21 comes in contact with the first bonding wire 13 if the first bonding wire 13 is connected earlier than the semi-spherical spacers 8 are formed.

Next, by repeating almost the same steps as those of FIG. 2D and the subsequent of the first manufacturing method, the semiconductor device 1 such as shown in FIG. 1 is completed.

By the above-mentioned first or second semiconductor device manufacturing method, by using the potting method or the screen printing method respectively, the semi-spherical spacers 8 are formed in such a manner that the second semiconductor chip 11 may be stacked on the first semiconductor chip 7 with a uniform spacing preserved therebetween and so can be actually formed with good controllability of a height thereof simply and without involving an increase in cost.

Thus, in the semiconductor device 1 according to the present embodiment, the second semiconductor chip 11 is stacked on the first semiconductor chip 7 via the plurality of semi-spherical spacers 8 having a uniform height, so that it is possible to preserve a uniform spacing between the first and second semiconductor chips 7 and 11.

Also, by the semiconductor device manufacturing methods according to the present embodiment, by using the potting method or the screen printing method, the semi-spherical spacers 8 are formed to enable stacking the second semiconductor chip 11 on the first semiconductor chip 7 with a uniform spacing preserved therebetween, so that it is possible to form the semi-spherical spacers 8 with good controllability of a height thereof.

Therefore, it is possible to improve the reliability and reduce the thickness of a semiconductor device in which a plurality of semiconductor chips is stacked in layers and sealed in a package.

Second Embodiment

Figure 7:
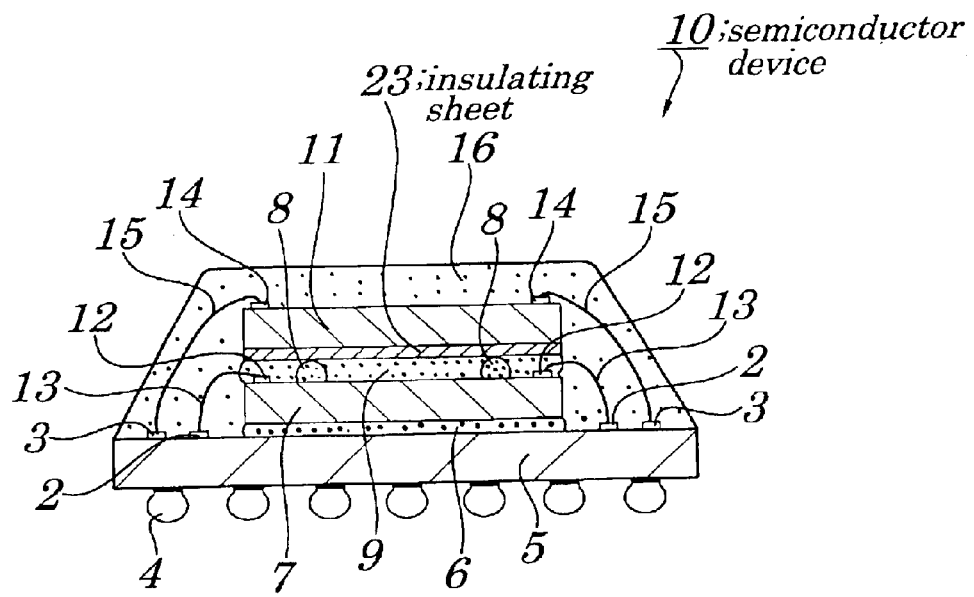
FIG. 7 is a cross-sectional view for showing a configuration of a semiconductor device according to a second embodiment of the present invention.

FIG. 7 is a cross-sectional view showing a configuration of a semiconductor device according to a second embodiment of the present invention. A semiconductor device 10 according to the present second embodiment greatly differs in configuration from that according to the above-mentioned first embodiment in a respect of stacking first and second semiconductor chips 7 and 11 one on the other via an insulating sheet 23.

That is, as shown in FIG. 7, in the semiconductor device 10 according to the present embodiment, the second semiconductor chip 11 is stacked on the first semiconductor chip 7 having roughly the same size as that thereof via a plurality of semi-spherical spacers 8 and an adhesive agent 9 as well as an insulating sheet 23. This insulating sheet 23 is made up of such a sheet as to become adhesive when heated and adhered beforehand to a back side (a surface to be adhered to the second semiconductor chip 7) of the second semiconductor chip 11.

To manufacture the semiconductor device 10 according to the present embodiment, for example, in place of the step of FIG. 2E of the first manufacturing method of the first embodiment, such a step can be carried out as to mount the second semiconductor chip 11 having the insulating sheet 23 formed beforehand on the back side thereof, on the first semiconductor chip 7 via the plurality of semi-spherical spacers 8 and the adhesive agent 9.

The configurations of the second embodiment except for the above are roughly the same as those of the above-mentioned first embodiment. Therefore, the same components in FIG. 7 as those of FIG. 1 are indicated by the same reference numerals and their description is omitted here.

In the semiconductor device 10 of the present embodiment, the second semiconductor chip 11 having the insulating sheet 23 formed on its stack surface is mounted on the first semiconductor chip 7 via the semi-spherical spacers 8 and the adhesive agent 9, thus giving almost the same effects as those by the first embodiment. Furthermore, it is possible to further improve insulation between the first and second semiconductor chips 7 and 11 because the insulating sheet 23 is placed between the first and second semiconductor chips 7 and 11.

Thus, the configuration according to the present embodiment provides almost the same effects as those described with the first embodiment.

In addition, this configuration of the present embodiment can further improve insulation between the plurality of semiconductor chips.

Third Embodiment

Figure 8:
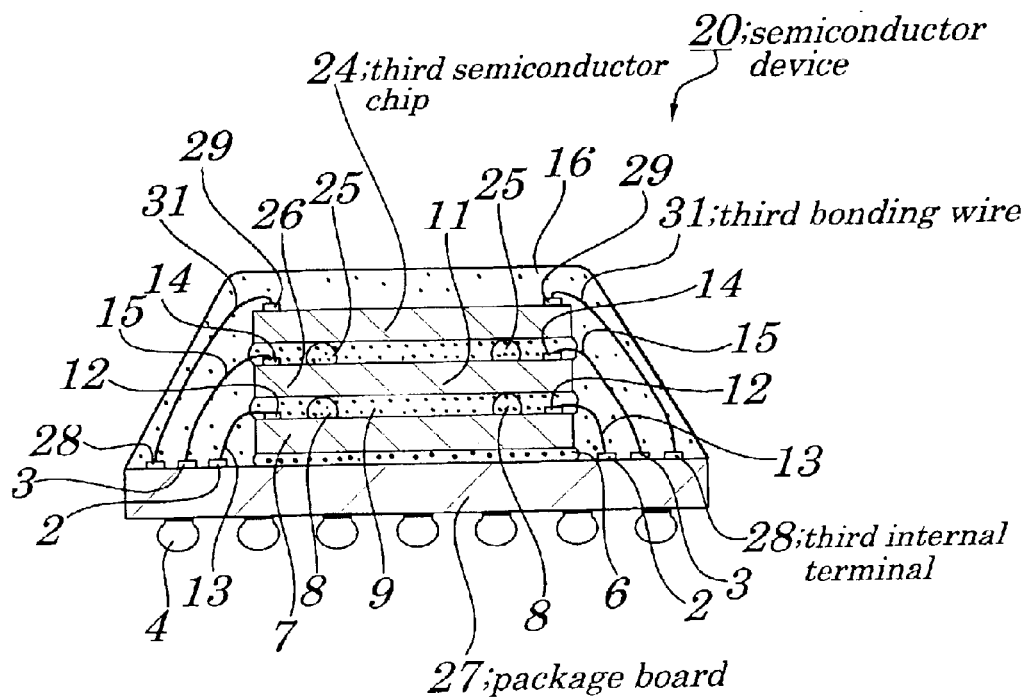
FIG. 8 is a cross-sectional view for showing a configuration of a semiconductor device according to a third embodiment of the present invention.

FIG. 8 is a cross-sectional view showing a configuration of a semiconductor device according to a third embodiment of the present invention. A semiconductor device 20 according to the present third embodiment greatly differs in configuration from that according to the above-mentioned first embodiment in a respect of stacking a plurality of semiconductor chips in a triple stacked manner.

That is, as shown in FIG. 8, in the semiconductor device 20 according to the present embodiment, a third semiconductor chip 24 is stacked on a second semiconductor chip 11 having roughly the same size as that thereof via a plurality of semi-spherical spacers 25 and an adhesive agent 26. In this case, the semi-spherical spacers 25 and the adhesive agent 26 are made of almost the same thermo-hardening resin as the above-mentioned semi-spherical spacers 8 and the adhesive agent 9 respectively. Furthermore, a package board 27 has an addition of a plurality of third internal terminals 28 formed thereon made of Cu, Ni, or a like, on which third bonding wires (conductor) 31 made of Al, Au, or a like are used to electrically interconnect a plurality of pad electrodes 29 made of Al, Au, or a like on the third semiconductor chip 24 and the third internal terminals 28.

To manufacture the semiconductor device 20 according to the third embodiment, for example, by utilizing the first manufacturing method of the first embodiment, the roughly same subsequence of processes as shown in FIG. 2C through FIG. 2F may be repeated again after the process of FIG. 2F has been performed.

In the semiconductor device 20 according to the present embodiment, the first, second, and third semiconductor chips 7, 11, and 24 are used in such a configuration that the first semiconductor chip 7 makes up a lowermost layer, the second semiconductor chip 11 makes up a middle layer, and the third semiconductor chip 24 makes up an uppermost layer. Thus, by increasing the number of semiconductor chips being stacked on top of each other in layers on the package board 27 (hereinafter, may be referred to as the number of semiconductor chip layers), it is possible to improve performance of the semiconductor device 20. Furthermore, when increasing the number of semiconductor chip layers in such a manner, the thickness of each of the plurality of semiconductor chips can be reduced as much as possible to provide almost the same effects as those by the first embodiment.

Thus, the configuration according to the present embodiment provides almost the same effects as those described with the first embodiment.

In addition, this configuration of the present embodiment can further improve performance of the semiconductor device by increasing the number of semiconductor chip layers.

Fourth Embodiment

Figure 9:
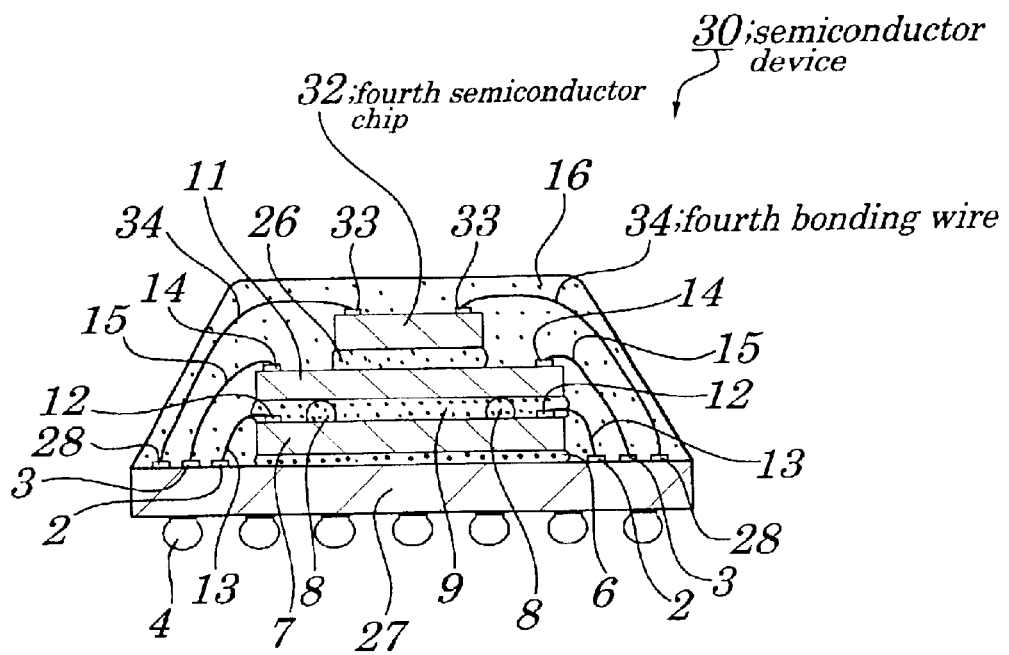
FIG. 9 is a cross-sectional view for showing a configuration of a semiconductor device according to a fourth embodiment of the present invention.

FIG. 9 is a cross-sectional view showing a configuration of a semiconductor device according to a fourth embodiment of the present invention. A semiconductor device 30 according to the present fourth embodiment greatly differs from that according to the above-mentioned third embodiment in such a configuration that a third layer in a triple-stacked structure of semiconductor chips, is made up of a plurality of semiconductor chips smaller in size than the other.

That is, as shown in FIG. 9, in the semiconductor device 30 according to the present embodiment, as a third-layer of a semiconductor chip, a fourth semiconductor chip 32 smaller in size than a second semiconductor chip 11 is stacked thereon via an adhesive agent 26. Furthermore, a plurality of fourth bonding wires (conductors) 34 respectively made of Al, Au, or a like are used to electrically interconnect a plurality of pad electrodes 33 made of Al, Au, or a like on the fourth semiconductor chip 32 and a third internal terminals 28.

To manufacture the semiconductor device 30 according to the present embodiment, for example, by utilizing a first manufacturing method of the first embodiment, the fourth semiconductor chip 32 may be used in place of a third semiconductor chip 24 in the third embodiment, and the roughly same subsequence of processes as shown in FIG. 2C through FIG. 2F may be repeated again after the process of FIG. 2F has been performed.

The semiconductor device 30 of the present embodiment is different from that of the third embodiment only in a respect of using the smaller-sized fourth semiconductor chip 32 which is smaller than the third semiconductor chip 24 which is stacked in the third layer and so can give almost the same effects as those by the third embodiment. Thus, the configuration according to the present embodiment provides almost the same effects as those described with the third embodiment.

Fifth Embodiment

Figure 10:
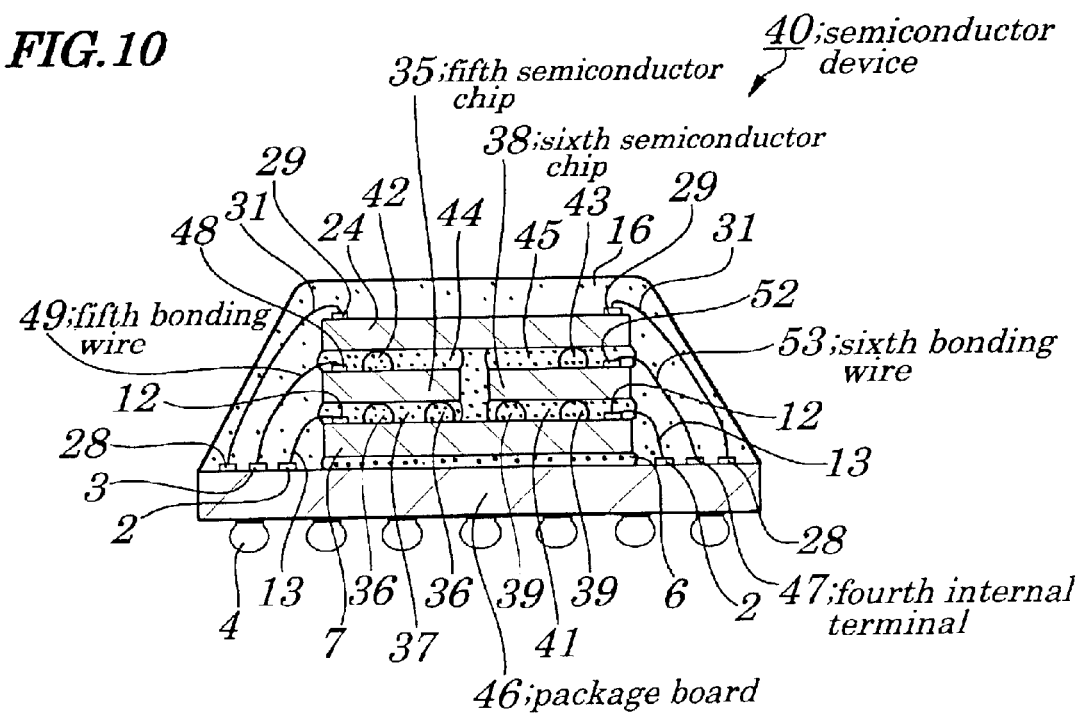
FIG. 10 is a cross-sectional view for showing a configuration of a semiconductor device according to a fifth embodiment of the present invention.
Figure 11A:
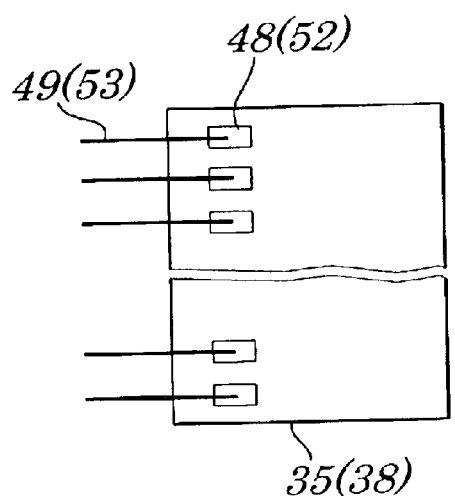
FIGS. 11A and 11B are plan views for showing a semiconductor chip used in the semiconductor device according to the fifth embodiment.
Figure 11B:
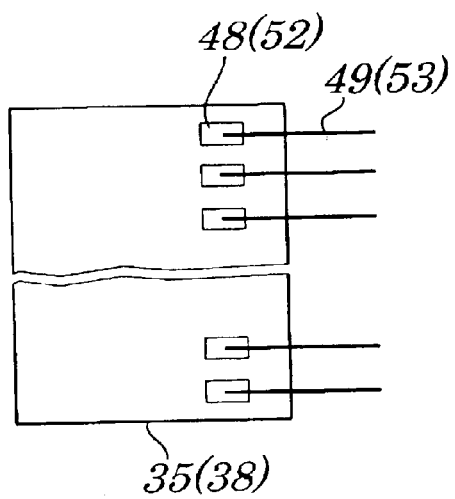

FIG. 10 is a cross-sectional view showing a configuration of a semiconductor device according to a fifth embodiment of the present invention; and FIGS. 1A and 11B are plan views for showing a semiconductor chip used in the semiconductor device according to the fifth embodiment. A semiconductor device 40 according to the present fifth embodiment greatly differs from that according to the above-mentioned third embodiment in a configuration that a second layer in a three-stack-layer structure of semiconductor chips is made up of a plurality of semiconductor chips smaller in size than the others.

That is, as shown in FIG. 10, in the semiconductor device 40 according to the present embodiment, as a second-layer of a semiconductor chips, a fifth semiconductor chip 35 smaller in size than a first semiconductor chip 7 is stacked thereon via a plurality of semi-spherical spacers 36 and an adhesive agent 37 and a sixth semiconductor chip 38 smaller in size than the first semiconductor chip 7 is stacked thereon via a plurality of semi-spherical spacers 39 and an adhesive agent 41.

As a third-layer semiconductor chip, on the other hand, a third semiconductor chip 24 is stacked on the fifth and sixth semiconductor chips 35 and 38 via a combination of semi-spherical spacers 42 and an adhesive agent 44 and that of semi-spherical spacers 43 and an adhesive agent 45 respectively. Furthermore, a package board 46 has an addition of a plurality of fourth internal terminals 47 formed thereon made of Cu, Ni, or a like.

Furthermore, fifth bonding wires (conductors) 49 made of Al, Au, or a like is used to electrically interconnect a plurality of pad electrodes 48 made of Al, Au, or a like on the fifth semiconductor chip 35 and a plurality of second internal terminals 3. Besides, a plurality of sixth bonding wires (conductors) 53 respectively made of Al, Au, or a like is used to electrically interconnect a plurality of pad electrodes 52 made of Al, Au, or a like on the sixth semiconductor chip 38 and a plurality of fourth internal terminals 47.

It is to be noted that on the fifth and sixth semiconductor chips 35 and 38 which make up the second layer, the pad electrodes 48 and the pad electrodes 52 are arranged, in configuration, in a row along the side edge portions of these chips 35 and 38 respectively as shown in FIG. 11A or in a row along the center lines of these chips 35 and 38 respectively as shown in FIG. 11B. This configuration is provided to facilitate connecting the bonding wires 49 and 53 to the semiconductor chips 35 and 38 respectively.

To manufacture the semiconductor device 40 according to the present embodiment, for example, by utilizing the first manufacturing method of the first embodiment, the fifth and sixth semiconductor chips 35 and 38 can be used in place of a second semiconductor chip 11 in the third embodiment when repeatedly carrying out roughly the same steps of FIGS. 2E and 2F after the step of FIG. 2D. The semiconductor device 40 of the present embodiment is different from that of the third embodiment only in a respect of replacing, in use, the second semiconductor chip 11 which is stacked in the second layer with the fifth and sixth semiconductor chips 35 and 38 which are smaller in size than that and so can give almost the same effects as those by the third embodiment. Thus, the configuration according to the present embodiment provides almost the same effects as those described with the third embodiment.

Sixth Embodiment

Figure 12:
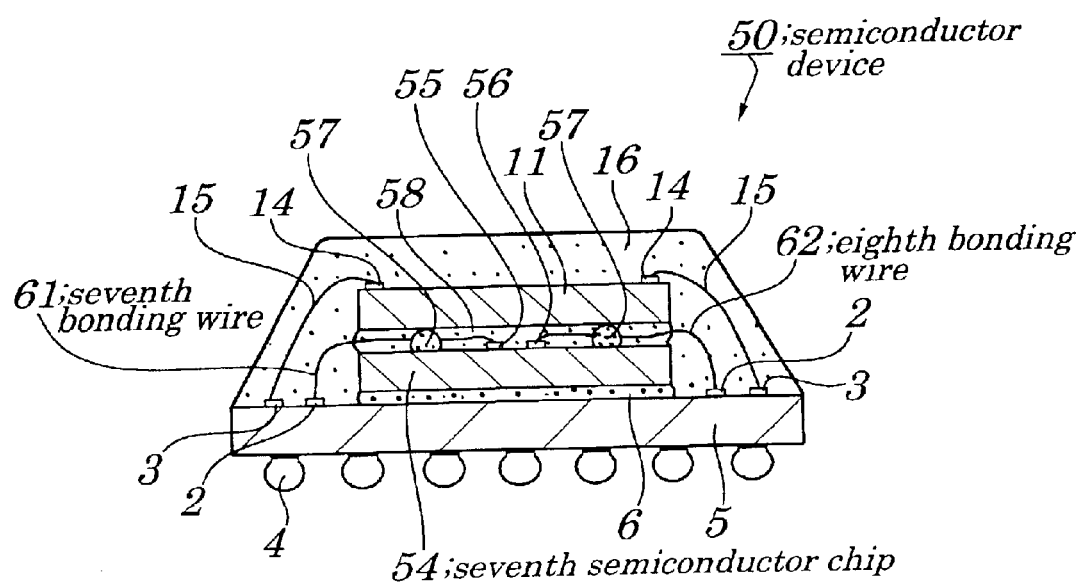
FIG. 12 is a cross-sectional view for showing a configuration of a semiconductor device according to a sixth embodiment of the present invention.
Figure 13A:
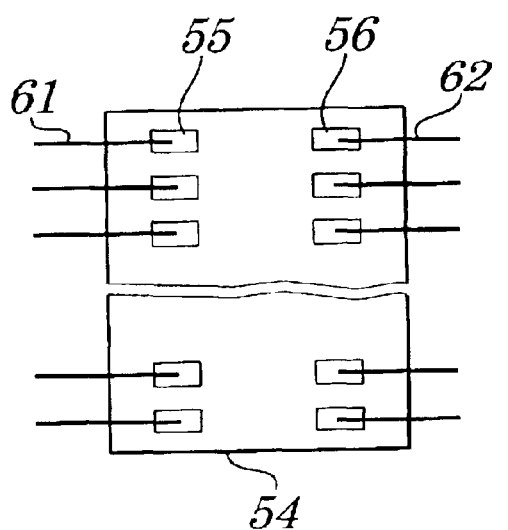
FIGS. 13A and 13B are plan views for showing a semiconductor chip used in the semiconductor device according to the sixth embodiment.
Figure 13B:
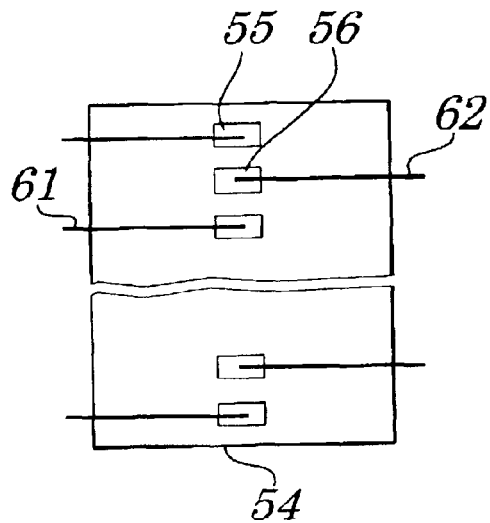

FIG. 12 is a cross-sectional view showing a configuration of a semiconductor device according to a sixth embodiment of the present invention; and FIGS. 13A and 13B are plan views for showing a semiconductor chip used in the semiconductor device according to the sixth embodiment. A semiconductor device 50 according to the present sixth embodiment greatly differs in configuration from that according to the above-mentioned first embodiment in a respect of giving a degree of freedom in arrangement of pad electrodes by altering their arrangement on a semiconductor chip.

That is, as shown in FIG. 12, in the semiconductor device 50 according to the present embodiment, as a first-layer semiconductor chip is there used a seventh semiconductor chip 54 in which pad electrodes 55 and 56 are arranged in two rows along the centerline thereof, on which the seventh semiconductor chip 54 is there stacked a second semiconductor chip 11 via a plurality of semi-spherical spacers 57 and an adhesive agent 58. Furthermore, a plurality of the pad electrodes 55 and 56 made of Al, AU, or a like on the seventh semiconductor chip 54 and first and second internal terminals 2 and 3 are electrically interconnected respectively by seventh and eighth bonding wires (conductor) 61 and 62 made of Al, Au, or a like.

It is to be noted that on the seventh semiconductor chip 54 which makes up the first layer, the pad electrodes 55 and 56 are arranged, in configuration, in two rows along the centerline of the seventh semiconductor chip 54 respectively as shown in FIG. 13A or in a row along the center line of the seventh semiconductor chip 54 as shown in FIG. 13B. This configuration of arranging the pad electrodes 55 and 56 along the centerline of the seventh semiconductor chip 54 is provided to give a degree of freedom in interconnecting seventh and eight bonding wires 61 and 52 and these two pad electrodes 55 and 56 respectively. The arrangement, however, may be changed arbitrarily.

To manufacture the semiconductor device 50 according to the present embodiment, for example, by utilizing the first manufacturing method of the first embodiment, almost the same steps as those of FIGS. 2A–2D can be carried out using the seventh semiconductor chip 54 in place of the first semiconductor chip 7 of the first embodiment.

The semiconductor device 50 according to the present embodiment differs from that according to the first embodiment only in a respect of replacing, in use, the first semiconductor chip 7 used in the first layer with the seventh semiconductor chip 54 in which a degree of freedom is given in arrangement of the pad electrodes 55 and 56, thus giving almost the same effects as those by the first embodiment.

Thus, the configuration according to the present embodiment provides almost the same effects as those described with the first embodiment.

In addition, this configuration of the present embodiment can give a degree of freedom in connecting the bonding wire to the pad electrode.

Seventh Embodiment

Figure 14:
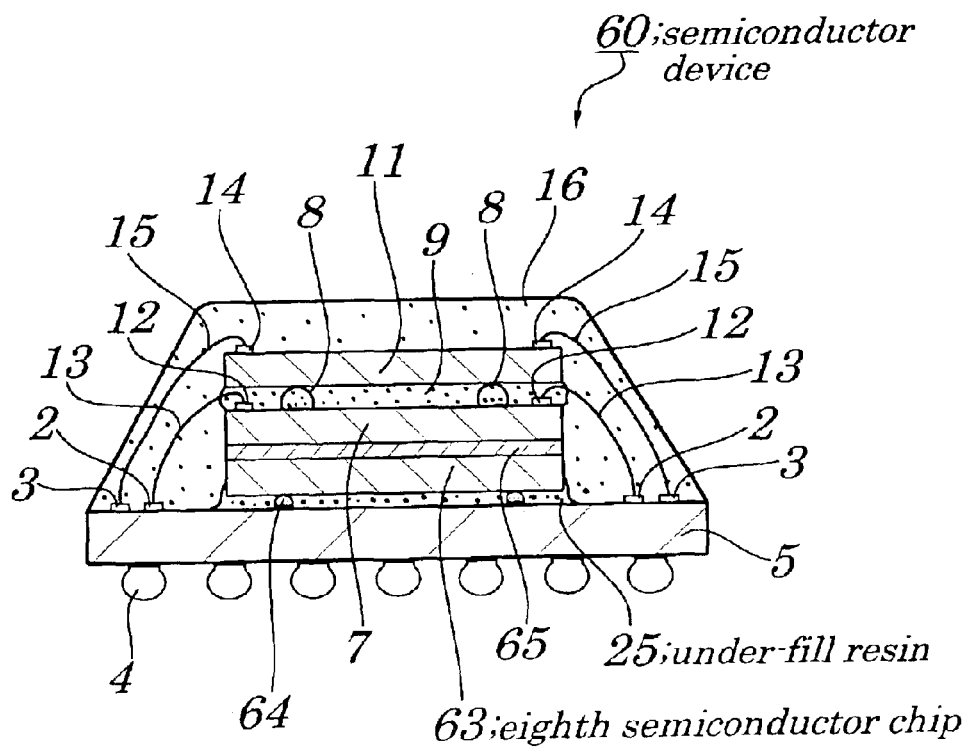
FIG. 14 is a cross-sectional view for showing a configuration of a semiconductor device according to a seventh embodiment of the present invention.

FIG. 14 is a cross-sectional view showing a configuration of a semiconductor device according to a seventh embodiment of the present invention; and FIGS. 15A to 15F are flow diagrams for showing a method for manufacturing the semiconductor device according to the seventh embodiment of the present invention, along steps thereof. A semiconductor device 60 according to the present seventh embodiment greatly differs in configuration from that according to the above-mentioned first embodiment in a respect of stacking a plurality of semiconductor chips including a flip-chip connection portion in layers.

That is, as shown in FIG. 14, in the semiconductor device 60 according to the present embodiment, as a first-layer semiconductor chip is there connected an eighth semiconductor chip 63 via a projecting electrode 64 to a wiring line (not shown) on a package board 5 in a flip-chip manner, on the back side of which the projecting electrode 64 is there also mounted a first semiconductor chip 7 via an adhesive agent 65. By thus conducting flip-chip connection on the eight semiconductor chip 63, necessity of a bonding wire can be eliminated to thereby avoid a delay in signal propagation caused by the existence of the bonding wire, thus increasing especially the operating speed of the semiconductor device 60. It is to be noted that a flip-chip connection portion on the back side of the semiconductor chip 63 is typically sealed in by an under-fill resin 25. The under-fill resin 25 has a role of protecting the flip-chip connection from the surroundings.

It is to be noted that the projecting electrode 64 may be made up of an Au stud bump or Au ball bump formed by the wire bonding method, an Au bump formed by plating, a solder bump, or a like.

The others are almost the same as those by the above-mentioned first embodiment. Therefore, the same components in FIG. 14 as those in FIG. 1 are indicated by the same reference numerals and so their explanation is omitted.

The following will describe a method for manufacturing the semiconductor device according to the present embodiment along steps thereof, with reference to FIGS. 15A-15F.

Figure 15A:
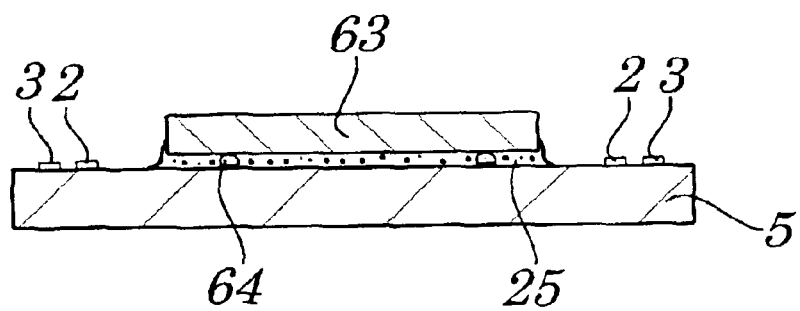
FIGS. 15A to 15F are flow diagrams for showing a method for manufacturing the semiconductor device according to the seventh embodiment of the present invention, along steps thereof.

First, as shown in FIG. 15A, on the package board 5 which is made of glass epoxy, ceramic, poly-imide, poly-amide, or a like and has respective pluralities of first and second internal terminals 2 and 3 both made of Cu, Ni, or a like formed on its right side, the eighth semiconductor chip 63 is mounted via the projecting electrode 64 in a flip-chip manner. Next, the under-fill resin 25 is applied to the back side of the eighth semiconductor chip 63.

Figure 15B:
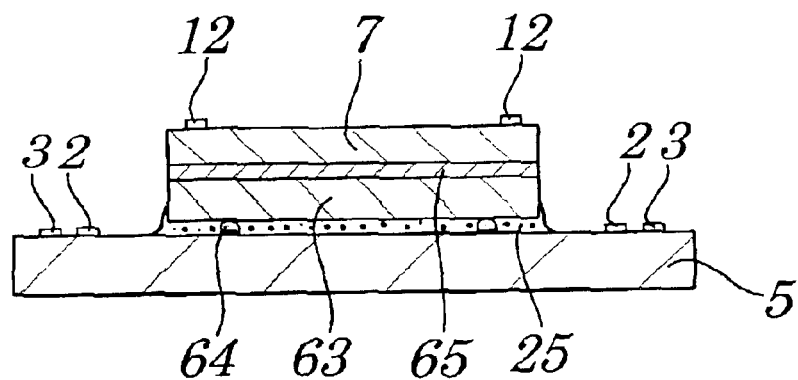

Next, as shown in FIG. 15B, the first semiconductor chip 7 is mounted via the adhesive agent 65 on the eighth semiconductor chip 63. At side edge portions of this first semiconductor chip 7 are formed a plurality of pad electrodes 12 made of Al, Au, or a like beforehand.

Figure 15C:
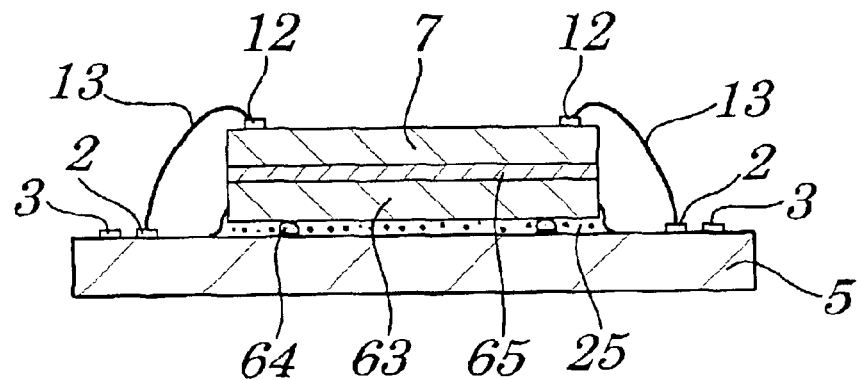

Next, as shown in FIG. 15C, a first bonding wire 13 made of Al, Au, or a like is connected by the wire bonding method between a pad electrode 12 on the first semiconductor chip 7 and the first internal terminal 2 on the package board 5.

Figure 15D:
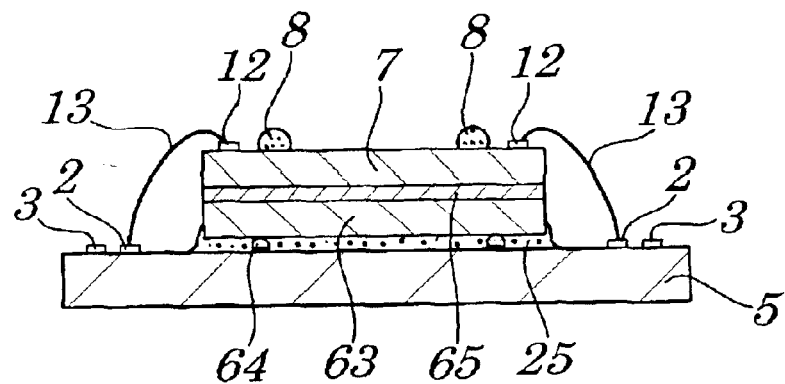

Next, as shown in FIG. 15D, a plurality of semi-spherical spacers 8 having a height of 60–70 μm is formed on the first semiconductor chip 7 by the potting method. The semi-spherical spacers 8 maybe formed using the earlier mentioned fast-hardening or photo-hardening resin in place of the above-mentioned thermo-hardening resin. The semi-spherical spacers 8 can be formed to a uniform height of 60–70 μm with good controllability by utilizing the potting technique.

Figure 15E:
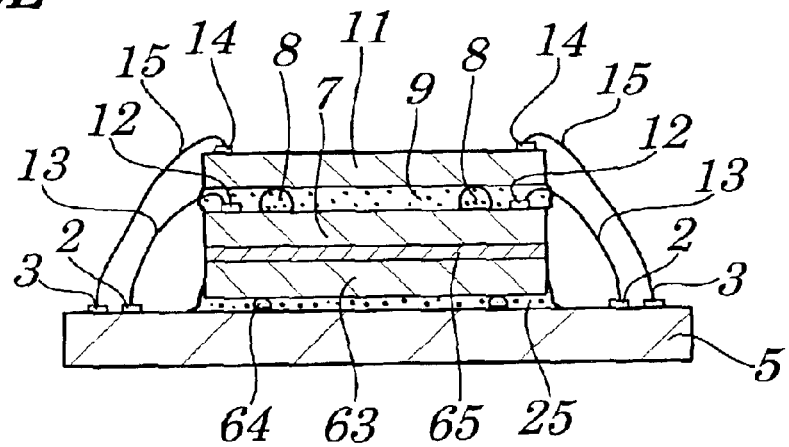

Next, as shown in FIG. 15E, by using the potting method, an adhesive agent 9 made of second liquid resin is applied on the first semiconductor chip 7 roughly at its center portion and then a second semiconductor chip 11 is mounted on the first semiconductor chip 7 via the plurality of semi-spherical spacers 8 and the adhesive agent 9. At side edge portions of this second semiconductor chip 11 there are formed a plurality of pad electrodes 14 made of Al, Au, or a like beforehand. In this case, since the semi-spherical spacers 8 having a uniform height are already formed on the first semiconductor chip 7, the second semiconductor chip 11 is stacked via the adhesive agent 9 on the first semiconductor chip 7 in a condition where it is held at the uniform and constant height. Therefore, the first bonding wire 13 connected to the first semiconductor chip 7 are protected by the semi-spherical spacers 8 and so do not come in contact with the second semiconductor chip 11. Next, the adhesive agent 9 yet to be hardened is heated and hardened thermally and then a plurality of second bonding wires 15 respectively made of Al, Au, or a like are connected by the wire bonding method between a pad electrode 14 on the second semiconductor chip 11 and the second internal terminal 3 on the package board 5.

Figure 15F:
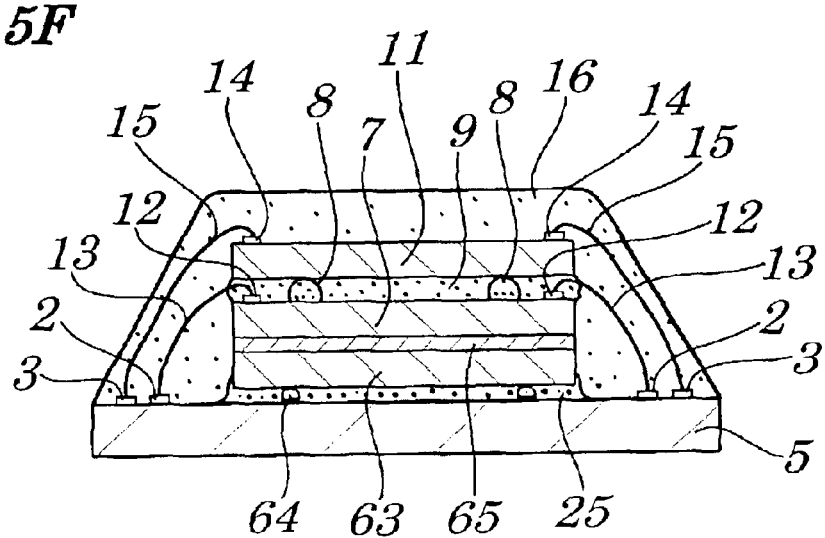

Next, as shown in FIG. 15F, by the transfer molding method, thermo-hardening resin is supplied over the entire structure including the first, second, and eighth semiconductor chips 7, 11, and 63 and the first and second bonding wires 13 and 15 on the package board 5 in such a manner as to seal it in and then heated to be hardened, thus forming a package 16.

Next, by forming projecting external terminals 4 made of Au, Cu, or a like on the back side of the package board 5, the semiconductor device 60 such as shown in FIG. 14 is completed. The semiconductor device 60 of the present embodiment is different from that of the first embodiment only in a respect of including the flip-chip-connected first-layer eighth semiconductor chip 63 in its structure wherein the plurality of semiconductor chips first, second, and eighth semiconductor chips 7, 11, and 63 is stacked in layers and so can give almost the same effects as those by the first embodiment.

Thus, the configuration according to the present embodiment provides almost the same effects as those described with the first embodiment.

In addition, the configuration according to the present embodiment includes the flip-flop connected semiconductor chip also, thus enabling increasing the operating speed of the semiconductor device.

Eighth Embodiment

A semiconductor device 70 according to the present eighth embodiment greatly differs in configuration from that according to the above-mentioned seventh embodiment in a respect of constituting each of second and third layers of a semiconductor chip smaller than the other.

Figure 16:
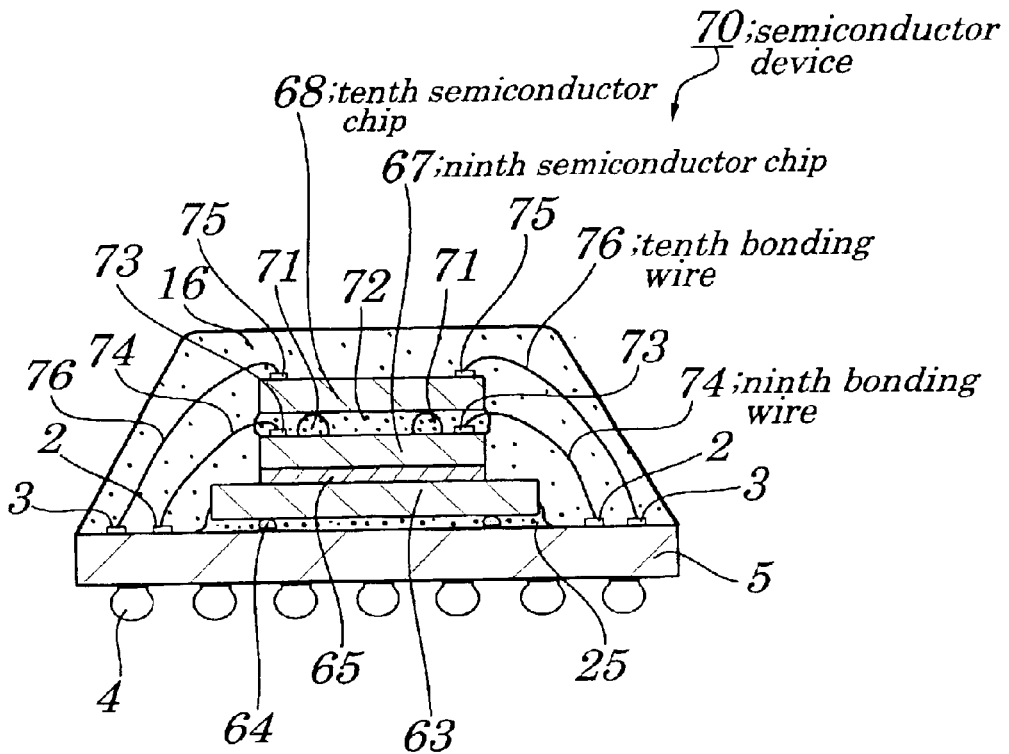
FIG. 16 is a cross-sectional view for showing a configuration of a semiconductor device according to an eighth embodiment of the present invention.

That is, as shown in FIG. 16, in the semiconductor device 70 according to the present embodiment, as the second-layer semiconductor chip is there mounted a ninth semiconductor chip 67 smaller in size than a first-layer eighth semiconductor chip 63 on the back side of the eighth semiconductor chip 63 via an adhesive agent 65. Moreover, as a third-layer semiconductor chip there is stacked a tenth semiconductor chip 68 smaller in size than the eighth semiconductor chip 63 on the ninth semiconductor chip 67 via a plurality of semi-spherical spacers 71 and an adhesive agent 72. Furthermore, a plurality of pad electrodes 73 made of Al, Au, or a like on the ninth semiconductor chip 67 and internal terminals 2 are electrically interconnected by ninth bonding wires (conductor) 74 made of Al, Au, or a like, while a plurality of pad electrodes 75 made of Al, Au, or a like on the tenth semiconductor chip 68 and internal terminals 3 are electrically interconnected by a plurality of tenth bonding wires (conductors) 76 respectively made of Al, Au, or a like.

The others are almost the same as those of the above-mentioned seventh embodiment. Therefore, the components in FIG. 16 corresponding to those of FIG. 14 are indicated by the same reference numerals and so their explanation is omitted.

The semiconductor device 70 of the present embodiment is different from that of the seventh embodiment only in a respect that each of the ninth and tenth semiconductor chips 67 and 68 is smaller in size than the first-layer eighth semiconductor chip 63, thus giving almost the same effects as those by the seventh embodiment.

Thus, the configuration according to the present embodiment also provides almost the same effects as those described with the seventh embodiment.

Ninth Embodiment

Figure 17:
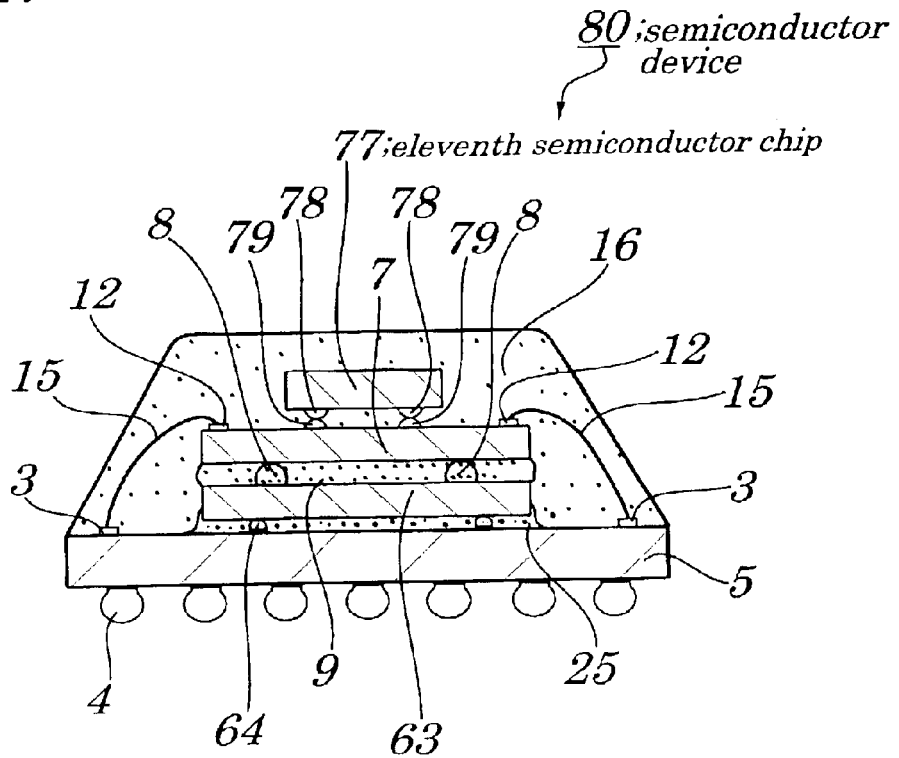
FIG. 17 is a cross-sectional view for showing a configuration of a semiconductor device according to a ninth embodiment of the present invention.

FIG. 16 is a cross-sectional view showing a configuration of a semiconductor device according to an eighth embodiment of the present invention; and FIG. 17 is a cross-sectional view for showing a configuration of a semiconductor device according to a ninth embodiment of the present invention.

A semiconductor device 80 according to the present ninth embodiment greatly differs from that according to the seventh embodiment in such a configuration that a third layer of a semiconductor chip is small in size and also connection in a flip-chip manner is applied to the third layer of the semiconductor chip.

That is, as shown in FIG. 17, in the semiconductor device 80 according to the present embodiment, an eleventh semiconductor chip 77 which makes up a third layer is formed smaller in size than a first semiconductor chip 7 which makes up a second layer and also is connected in the flip-chip manner via projecting electrodes 78 to projecting electrodes 79 formed on the first semiconductor chip 7. By thus conducting flip-chip connection not only on first-layer eighth semiconductor chip 63 but also on the third-layer eleventh semiconductor chip 77, the semiconductor device 80 can be improved further in operating speed.

The semiconductor device 80 of the present embodiment is different from that of the seventh embodiment only in a respect that the third-layer eleventh semiconductor chip 77 is smaller in size than the second-layer first semiconductor chip 7 and also connected in the flip-chip manner, thus giving almost the same effects as those by the seventh embodiment.

Thus, the configuration according to the present embodiment also provides almost the same effects as those described with the seventh embodiment.

In addition, this configuration of the present embodiment can further increase the operating speed of the of semiconductor chips.

Tenth Embodiment

Figure 18:
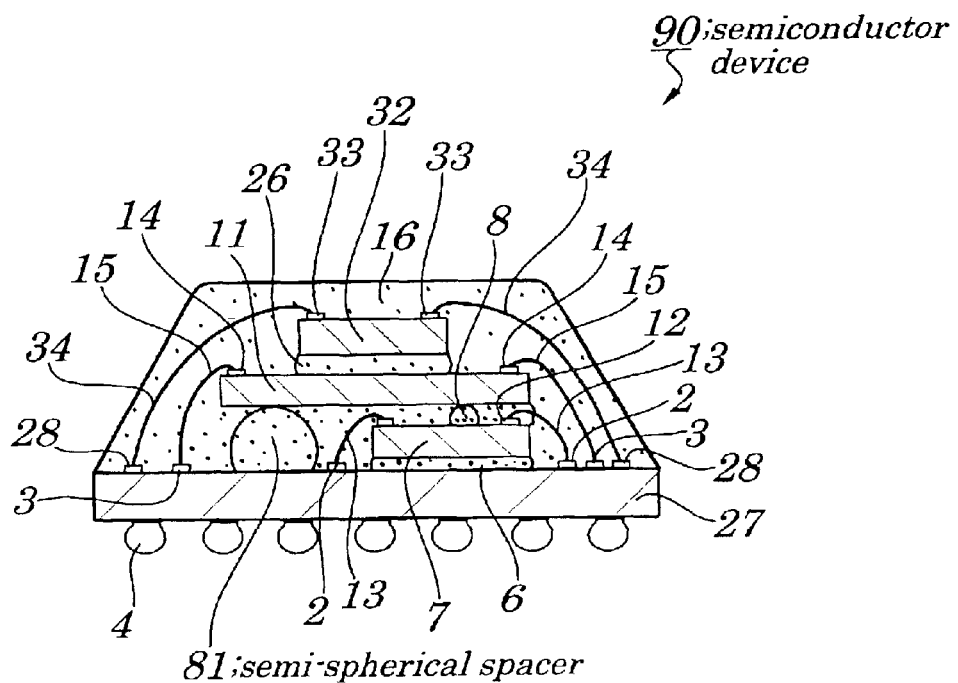
FIG. 18 is a cross-sectional view for showing a configuration of a semiconductor device according to a tenth embodiment of the present invention.

FIG. 18 is a cross-sectional view showing a configuration of a semiconductor device according to a tenth embodiment of the present invention. A semiconductor device 90 according to the present tenth embodiment greatly differs in configuration from that according to the fourth embodiment in a respect that spacers for supporting an upper-layer semiconductor chip are formed also at a position not on a lower-layer semiconductor chip.

That is, as shown in FIG. 18, in the semiconductor device 90 according to the present embodiment, a second-layer second semiconductor chip 11 is supported by a semi-spherical spacer 8 formed on a first-layer first semiconductor chip 7 as well as by a semi-spherical spacer 81 formed on a package board 27 at a position not on the first semiconductor chip 7. In such a manner, according to the present embodiment, it is not necessary to form all of the plurality of spacers which support the upper-layer semiconductor chip (second semiconductor chip 11 in this embodiment) on the lower-layer semiconductor chip (first semiconductor chip 7 in this embodiment).

The semiconductor device 90 of the present embodiment is different from that of the fourth embodiment only in a respect that the semi-spherical spacer 81 for supporting the second semiconductor chip 11 which constitutes the upper-layer is formed also at a position not on the lower-layer first semiconductor chip 7, thus giving almost the same effects as those by the seventh embodiment.

Thus, the configuration according to the present embodiment also provides almost the same effects as those described with the fourth embodiment.

It is apparent that the present invention is not limited to the above embodiments but may be changed and modified without departing from the scope and spirit of the invention.

For example, although the embodiments have been described with reference to an example in which projecting external terminals are formed on the back side of the package board, the external terminals may be of any other shape such as a lead shape. Furthermore, the conductor used to electrically interconnect the pad electrode on the semiconductor chip and the internal terminal on the package board is not limited to such a wire as described in the embodiments but may be a strip-shaped lead such as used on a Tape Carrier Package (TCP).

Furthermore, the material which the semi-spherical spacers are made of is not limited to an insulating material (insulator) such as thermo-hardening resin but may be a conductive material (conductor) such as conductive paste made of silver (Ag), for example. Furthermore, the semi-spherical spacers may be made up of a gold stud bump, ball bump, or a like formed by the wire bonding method. Furthermore, a plurality of gold bumps may be stacked one on another in order to provide a certain height of the semi-spherical spacers. The spacers may also be made up of a particulate insulating material such as used in printing paste by the screen printing method or a like. In this case, this particulate insulating material can be mixed with an adhesive agent and supplied by using the potting method or a like. Furthermore, an adhesive agent may be supplied first and then mixed with a particulate insulating material.

Furthermore, the semi-spherical spacers may be formed not only by the potting method or the screen printing method but also by a non-contact type jet dispenser method, in which case it is advantageous especially when forming semi-spherical spacers having a high accuracy in size. The semi-spherical spacers need not always be semi-spherical but only needs to be projecting.

The package board, on the other hand, is not limited to an insulated board but may be a conductor board such as a lead frame. Also, the package board is not limited to such a configuration example in which the entire structure is enclosed by an insulator such as thermo-hardening resin but may be a metal container in which an inert gas such as nitrogen is sealed. Furthermore, in a case where a plurality of semiconductor chips is stacked in layers, the number and the size of chips mounted on each of the layers can be changed arbitrarily corresponding to a purpose, use, or a like thereof.

Figure 19:
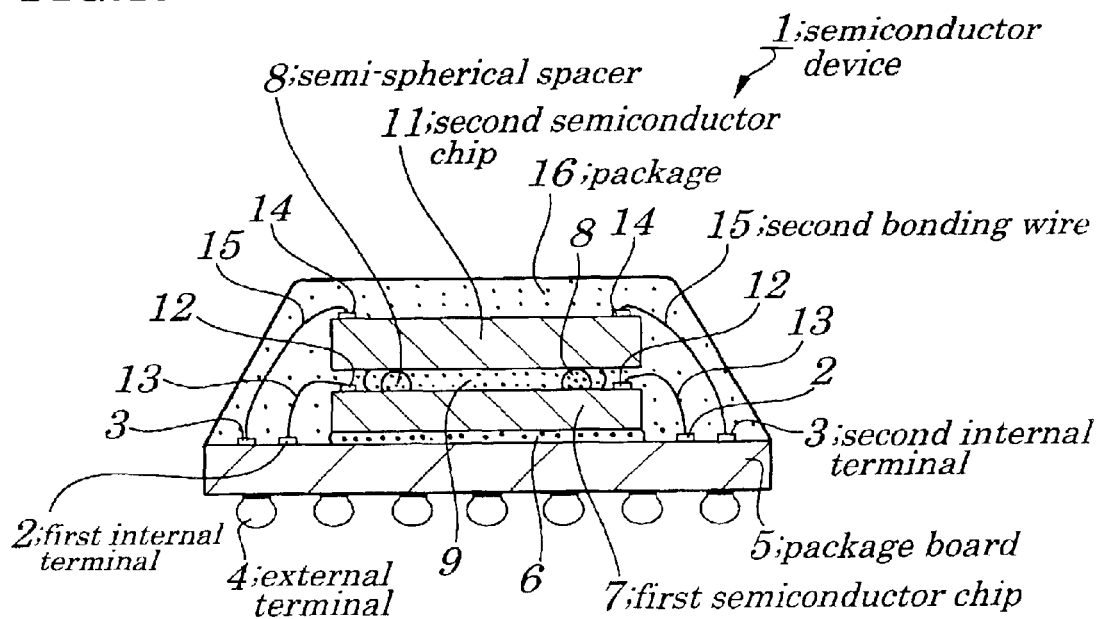
FIG. 19 is a cross-sectional view for showing a configuration of a variant of the semiconductor device according to the first embodiment of the present invention.
Figure 20:
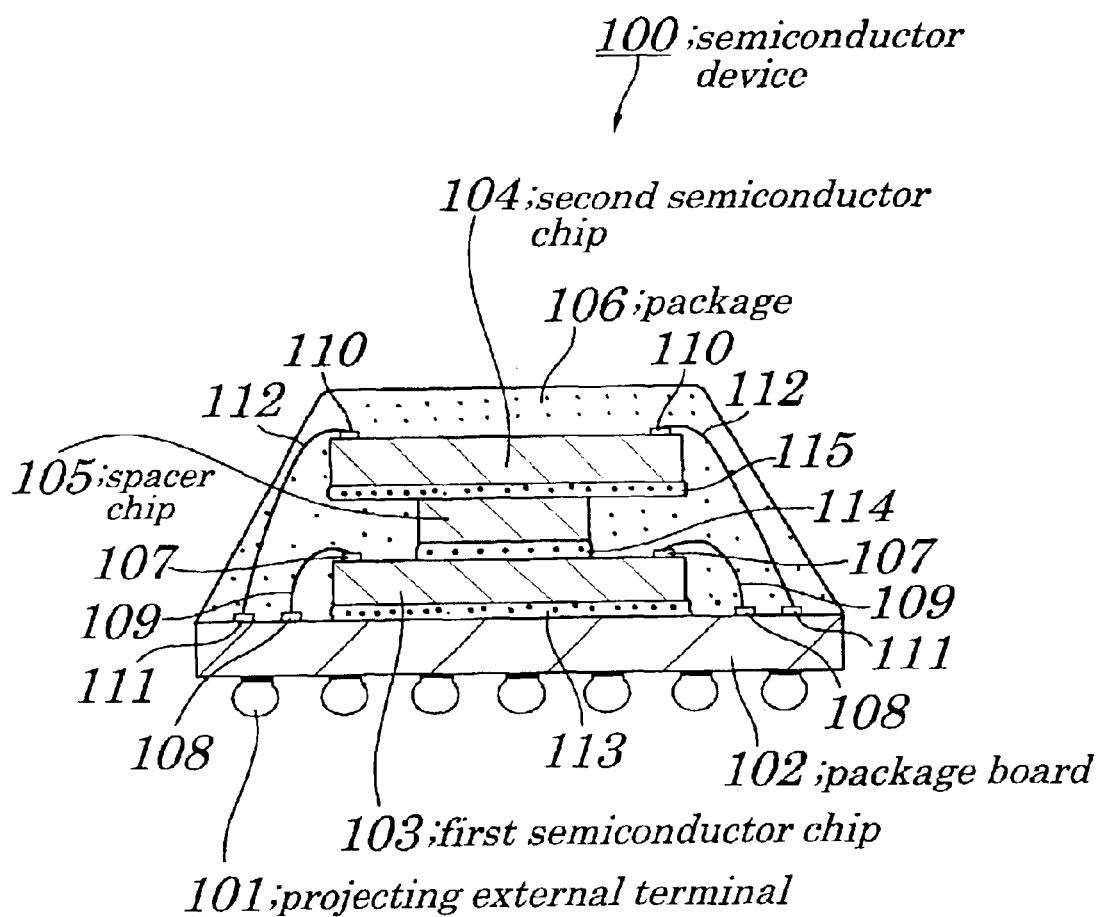
FIG. 20 is a cross-sectional view for showing a configuration of a conventional semiconductor device.
Figure 21A:
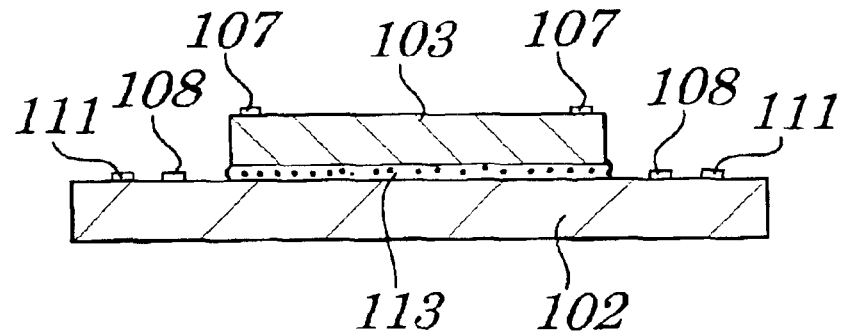
FIGS. 21A to 21F are flow diagrams for showing a method for manufacturing the conventional semiconductor device, along steps thereof.
Figure 21B:
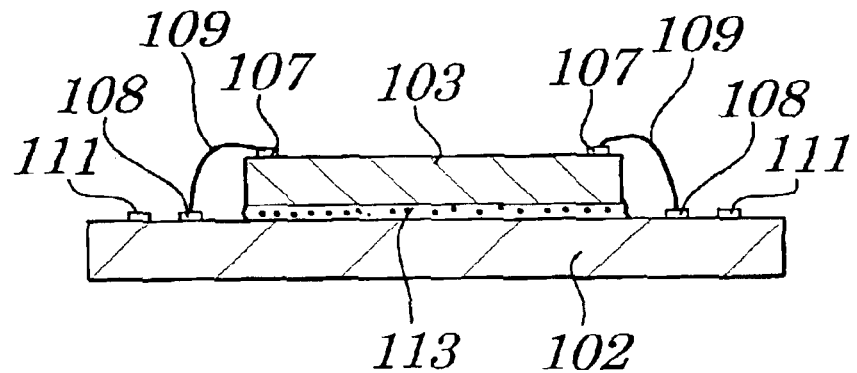
Figure 21C:
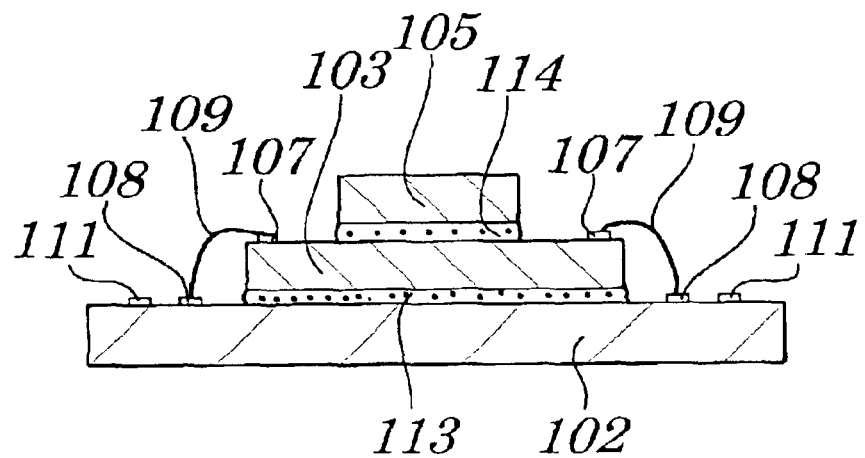
Figure 21D:
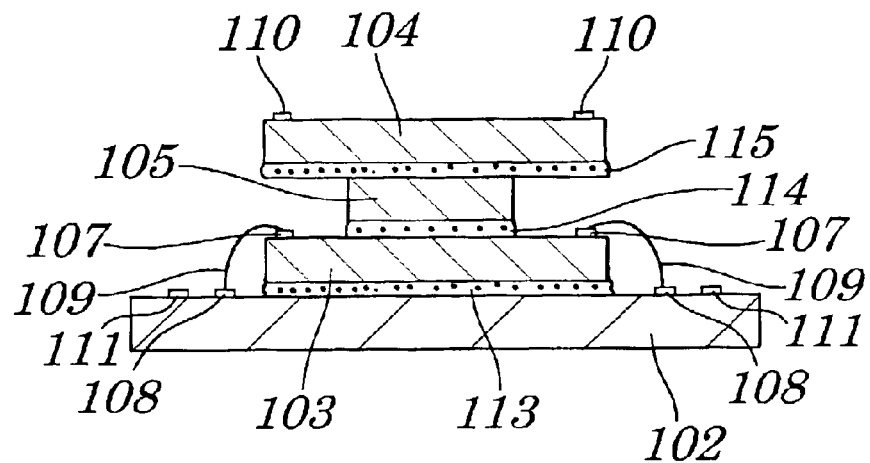
Figure 21E:
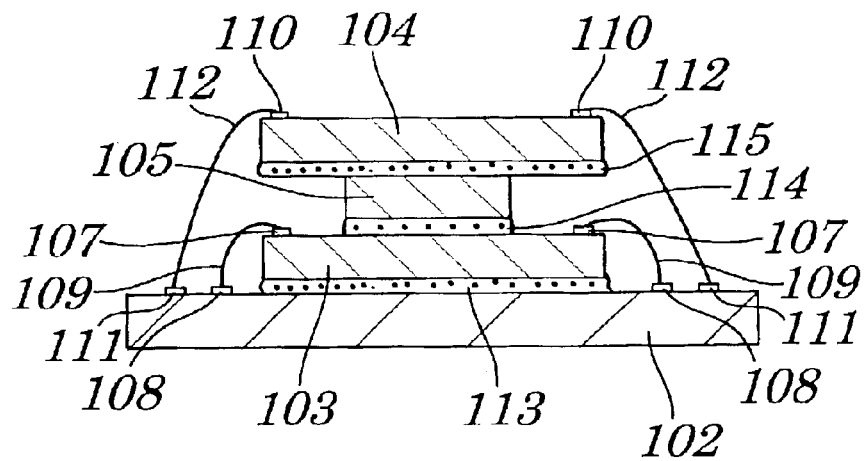
Figure 21F:
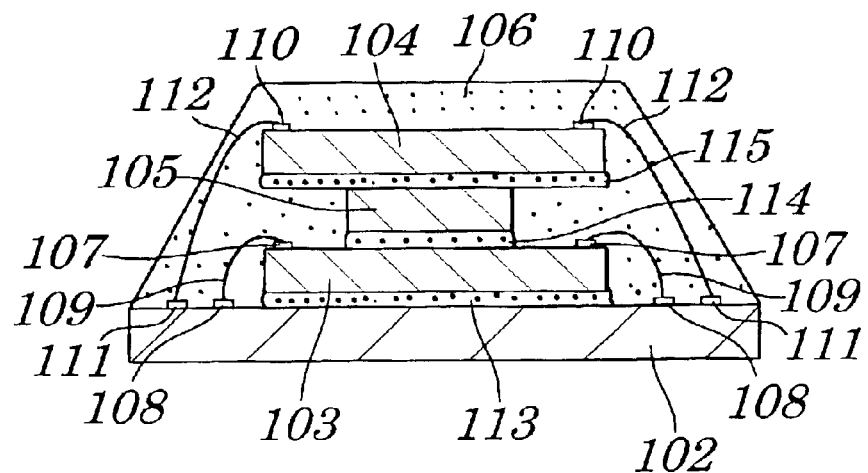
Figure 22:
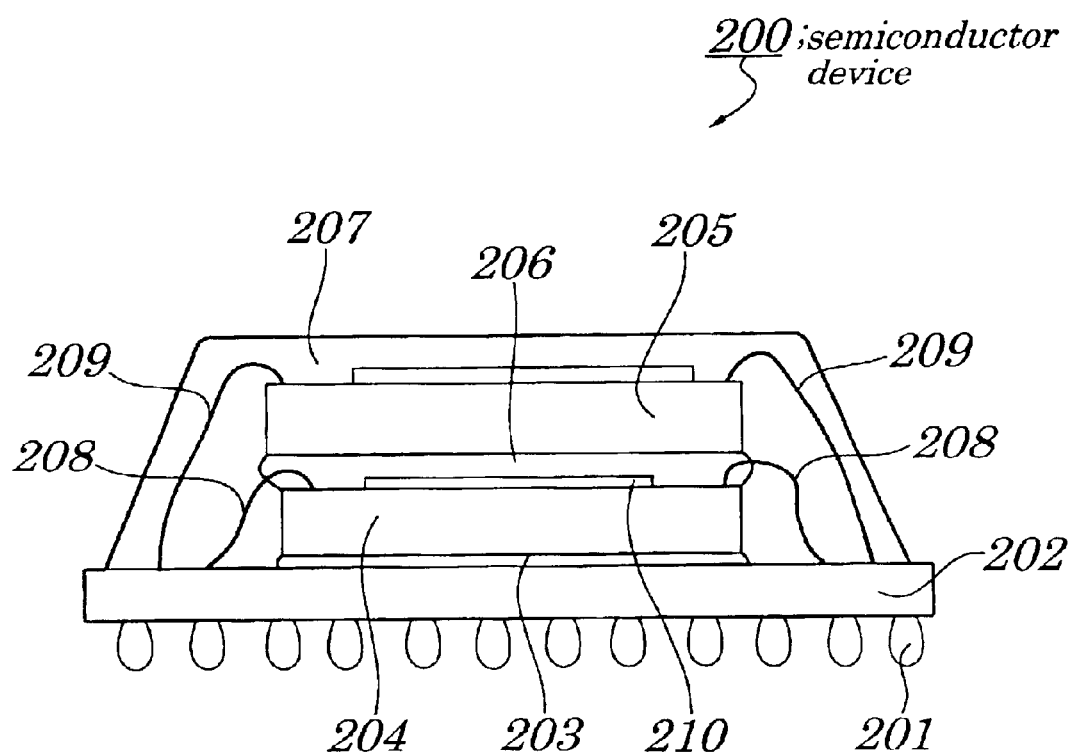
FIG. 22 is a cross-sectional view for showing a configuration of another conventional semiconductor device.

Also, although the embodiments have been described with reference to an example where an upper-layer semiconductor chip is stacked on a lower-layer semiconductor chip using an adhesive agent, it is not always necessary to use the adhesive agent. Even if the adhesive agent is used, as shown in a variant of the first embodiment illustrated in FIG. 19, the adhesive agent 9 may be supplied in such a manner as not to extend over the entire stack surfaces of the upper-layer and lower-layer first and second semiconductor chips 7 and 11. Also, the value of the height of the semi-spherical spacers 8 is given only in one example and so can be changed arbitrarily corresponding to the bonding wire diameter, the semiconductor chip thickness, or the like. In short, by the present invention, in a configuration where a plurality of semiconductor chips is stacked in layers, it is only necessary that at least an upper-layer semiconductor mounted on a certain layer be stacked via a plurality of spacers including a spacer which is formed at least on a lower-layer semiconductor chip.

What is claimed is:

1. A semiconductor device in which a plurality of semiconductor chips is stacked in layers and sealed in a package, wherein:

an upper-layer semiconductor chip is stacked via a plurality of spacers on a lower-layer semiconductor chip, such that said plural spacers directly contact both of said upper-layer and said lower-layer semiconductor chips, said plural spacers being made of a photo-hardening resin;

at least one of said plurality of spacers is formed on said lower-layer semiconductor chip; and said upper-layer semiconductor chip, said plurality of spacers, and said lower-layer semiconductor chip are sealed in said package.

2. The semiconductor device according to claim 1, wherein said plurality of spacers is made up of a projecting structure.

3. The semiconductor device according to claim 1, wherein said package is made up of a container which seals therein an inert gas.

4. The semiconductor device according to claim 1, wherein said upper-layer semiconductor chip is stacked via an adhesive agent on said lower-layer semiconductor chip.

5. The semiconductor device according to claim 4, wherein said adhesive agent is made of thermo-hardening resin.

6. The semiconductor device according to claim 1, wherein said plurality of semiconductor chips stacked in said layers is different in size from each other.

7. The semiconductor device according to claim 1, wherein connection in a flip-chip manner is applied to at least one semiconductor chip out of said plurality of semiconductor chips stacked in said layers.

8. A semiconductor device in which a plurality of semiconductor chips is stacked in layers and sealed in a package, comprising:
- a lower-layer semiconductor chip having a first surface and an opposing second surface, and mounted on a package board;
- an upper-layer semiconductor chip which is stacked via a plurality of spacers on said first surface of said lower-layer semiconductor chip, such that said plural spacers are directly contacting both said lower-layer and said upper-layer semiconductor chips, said plural spacers being made of a photo-hardening resin;
- at least one first conductor interconnecting electrically at least one first electrode on said first surface of said lower-layer semiconductor chip and at least one first internal terminal on said package board;
- at least one second conductor electrically interconnecting at least one second electrode on said upper-layer semiconductor chip and at least one second internal terminal on said package board; and
- said package sealing therein said lower-layer semiconductor chip, said upper-layer semiconductor chip, and said at least one first conductor and said at least one second conductor which are all on said package board.

9. The semiconductor device according to claim 8, wherein said plurality of spacers is made up of a projecting structure.

10. The semiconductor device according to claim 8, wherein said package is made up of an insulator.

11. The semiconductor device according to claim 8, wherein said package is made up of a container which seals therein an inert gas.

12. The semiconductor device according to claim 8, wherein said upper-layer semiconductor chip is stacked via an adhesive agent on said lower-layer semiconductor chip.

13. The semiconductor device according to claim 12, wherein said adhesive agent is made of thermo-hardening resin.

14. The semiconductor device according to claim 8, wherein said package board is made of an insulating board.

15. The semiconductor device according to claim 14, wherein at least one external terminal is formed on a back side which is opposite to a right side of said package board on which said at least one first internal terminal and said at least one second terminal are respectively formed.

16. The semiconductor device according to claim 8, wherein said plurality of semiconductor chips stacked in said layers is different in size from each other.

17. The semiconductor device according to claim 8, wherein connection in a flip-chip manner is applied to at least one semiconductor chip out of said plurality of semiconductor chips stacked in said layers.

18. The semiconductor device according to claim 8, wherein connection in a flip-chip manner is applied to at least one of said plurality of semiconductor chips is, instead of using said at least one first conductor or said at least one second conductor.

19. A semiconductor device manufacturing method for stacking a plurality of semiconductor chips in layers and sealing said plurality of semiconductor chips in a package, comprising the steps of:
- forming a plurality of spacers directly on a lower-layer semiconductor chip;
- stacking an upper-layer semiconductor chip via said plurality of spacers on said lower-layer semiconductor chip, such that said plural spacers directly contact said upper-layer semiconductor chip, said plural spacers being made of photo-hardening resin; and
- sealing said lower-layer semiconductor chip, said plurality of spacers, and said upper-layer semiconductor chip in an insulating material making up said package.

20. A semiconductor device manufacturing method for stacking a plurality of semiconductor chips in layers and sealing said plurality of semiconductor chips in a package, comprising:
- a lower-layer semiconductor chip mounting step of mounting a lower-layer semiconductor chip on a package board;
- a first connecting step of interconnecting electrically at least one first internal terminal on said package board and at least one first electrode on said lower-layer semiconductor chip using at least one first conductor;
- a spacer formation step of forming a plurality of spacers on said lower-layer semiconductor chip;
- an upper-layer semiconductor chip stacking step of stacking an upper-layer semiconductor chip via said plurality of spacers on said lower-layer semiconductor chip;
- a second connecting step of interconnecting electrically at least one second internal terminal on said package board and at least one second electrode on said upper-layer semiconductor chip using at least one second conductor; and
- a sealing step of sealing said lower-layer semiconductor chip, said upper-layer semiconductor chip, and said at least one first conductor and said at least one second conductor in an insulating material making up said package,
- wherein said spacer formation step is performed by supplying liquid resin and then photo-hardening said liquid resin.

21. The semiconductor device manufacturing method according to claim 20, wherein said spacer formation step is performed after said first connecting step.

22. The semiconductor device manufacturing method according to claim 20, wherein said spacer formation step is performed before said first connecting step.

23. The semiconductor device manufacturing method according to claim 20, wherein said liquid resin is supplied using a potting method, a screen printing method, or a non-contact type jet dispenser method.

24. The semiconductor device manufacturing method according to claim 20, wherein said method comprises an adhesive agent formation step of forming an adhesive agent on said lower-layer semiconductor chip before said upper-layer semiconductor chip stacking step.

25. The semiconductor device manufacturing method according to claim 20, wherein said method comprises an insulating sheet formation step of forming an insulating sheet on a surface of said upper-layer semiconductor chip, said surface facing said lower-layer semiconductor chip, before said upper-layer semiconductor chip stacking step.

26. The semiconductor device manufacturing method according to claim 20, wherein, in said first connecting step, at least one first internal terminal on said package board and at least one first electrode on said lower-layer semiconductor chip are interconnected electrically using a first flip-chip connection method, instead of said first conductor.

27. The semiconductor device manufacturing method according to claim 20, wherein, in said second connecting step, at least one second internal terminal on said package board and at least one second electrode on said lower-layer semiconductor chip are interconnected electrically using a second flip-chip connection method, instead of said second conductor.

28. The device as claimed in claim 20, wherein said first and second conductors are bonding wires.

29. The device as claimed in claim 1, wherein said plural spacers are semi-spherical.

30. A semiconductor device in which a plurality of semiconductor chips is stacked in layers and sealed in a package, wherein:
   an insulating sheet is adhered on a surface of an upper-layer semiconductor chip;
   said upper-layer semiconductor chip is stacked via a plurality of spacers and said insulating sheet on a lower-layer semiconductor chip, such that said plural spacers directly contact both said insulating sheet and said lower-layer semiconductor chips, said plural spacers being made of a photo-hardening resin;
   at least one of said plurality of spacers is formed on said lower-layer semiconductor chip; and
   said upper-layer semiconductor chip, said insulating sheet, said plurality of spacers, and said lower-layer semiconductor chip are sealed in said package.

31. A semiconductor device in which a plurality of semiconductor chips is stacked in layers and sealed in a package, comprising:
   a lower-layer semiconductor chip having a first surface and an opposing second surface, and being mounted on a package board;
   an insulating sheet adhered on a surface of an upper-layer semiconductor chip;
   said upper-layer semiconductor chip is stacked via a plurality of spacers and said insulating sheet on said first surface of said lower-layer semiconductor chip, such that said plural spacers are directly contacting both said insulating sheet and said lower-layer semiconductor chip, said plural spacers being made of a photo-hardening resin;
   at least one first conductor interconnecting electrically at least one first electrode on said first surface of said lower-layer semiconductor chip and at least one first internal terminal on said package board;
   at least one second conductor electrically interconnecting at least one second electrode on said upper-layer semiconductor chip and at least one second internal terminal on said package board; and
   said package sealing therein said lower-layer semiconductor chip, said upper-layer semiconductor chip, said insulating sheet, and said at least one first conductor and said at least one second conductor which are all on said package board.

32. The device as claimed in claim 31, wherein said first and second conductors are bonding wires.

33. The device as claimed in claim 30, wherein said plural spacers are semi-spherical.

* * * * *